US008197894B2

(12) United States Patent
Miller et al.

(10) Patent No.: US 8,197,894 B2
(45) Date of Patent: *Jun. 12, 2012

(54) METHODS OF FORMING SPUTTERING TARGETS

(75) Inventors: Steven A. Miller, Canton, MA (US); Olaf Schmidt-Park, Needham, MA (US); Prabhat Kumar, Framingham, MA (US); Richard Wu, Chelmsford, MA (US); Shuwei Sun, Framingham, MA (US); Stefan Zimmermann, Laufenburg (DE)

(73) Assignees: H.C. Starck GmbH, Golsar (DE); H.C. Starck Inc., Newton, MA (US)

(*) Notice: Subject to any disclaimer, the term of this patent is extended or adjusted under 35 U.S.C. 154(b) by 1236 days.

This patent is subject to a terminal disclaimer.

(21) Appl. No.: 11/937,164

(22) Filed: Nov. 8, 2007

(65) Prior Publication Data

US 2008/0271779 A1 Nov. 6, 2008

Related U.S. Application Data

(60) Provisional application No. 60/915,967, filed on May 4, 2007.

(51) Int. Cl.
B05D 1/12 (2006.01)

(52) U.S. Cl. .......................... 427/192; 427/201; 427/427

(58) Field of Classification Search .................. 427/192, 427/201, 427
See application file for complete search history.

(56) References Cited

U.S. PATENT DOCUMENTS

| 3,436,299 A | 4/1969 | Halek |
| 3,990,784 A | 11/1976 | Gelber |
| 4,011,981 A | 3/1977 | Danna et al. |
| 4,073,427 A | 2/1978 | Keifert et al. |
| 4,140,172 A | 2/1979 | Corey |
| 4,202,932 A | 5/1980 | Chen et al. |
| 4,209,375 A * | 6/1980 | Gates et al. ............. 204/192.16 |
| 4,291,104 A | 9/1981 | Keifert |
| 4,459,062 A | 7/1984 | Siebert |
| 4,483,819 A | 11/1984 | Albrecht et al. |
| 4,508,563 A | 4/1985 | Bernard et al. |
| 4,510,171 A | 4/1985 | Siebert |
| 4,537,641 A | 8/1985 | Albrecht et al. |
| 4,722,756 A | 2/1988 | Hard |
| 4,731,111 A | 3/1988 | Kopatz et al. |
| 4,818,629 A | 4/1989 | Jenstrom et al. |
| 4,915,745 A | 4/1990 | Pollock et al. |
| 4,964,906 A | 10/1990 | Fife |
| 5,061,527 A | 10/1991 | Watanabe et al. |
| 5,091,244 A | 2/1992 | Biornard |
| 5,147,125 A | 9/1992 | Austin |
| 5,242,481 A | 9/1993 | Kumar |
| 5,270,858 A | 12/1993 | Dickey |
| 5,271,965 A | 12/1993 | Browning |
| 5,302,414 A | 4/1994 | Alkhimov et al. |
| 5,305,946 A | 4/1994 | Heilmann |
| 5,330,798 A | 7/1994 | Browning |
| 5,580,516 A | 12/1996 | Kumar |
| 5,612,254 A | 3/1997 | Mu et al. |
| 5,679,473 A | 10/1997 | Murayama et al. |
| 5,693,203 A | 12/1997 | Ohhashi et al. |
| 5,795,626 A | 8/1998 | Gabel et al. |
| 5,859,654 A | 1/1999 | Radke et al. |
| 5,954,856 A | 9/1999 | Pathare et al. |
| 5,972,065 A | 10/1999 | Dunn et al. |
| 5,993,513 A | 11/1999 | Fife |
| 6,030,577 A | 2/2000 | Commandeur et al. |
| 6,136,062 A | 10/2000 | Loffelholz et al. |
| 6,139,913 A | 10/2000 | Van Steenkiste et al. |
| 6,171,363 B1 | 1/2001 | Shekhter et al. |
| 6,189,663 B1 | 2/2001 | Smith et al. |
| 6,197,082 B1 | 3/2001 | Dorvel et al. |
| 6,238,456 B1 | 5/2001 | Wolf et al. |
| 6,245,390 B1 | 6/2001 | Baranovski et al. |
| 6,258,402 B1 | 7/2001 | Hussary et al. |
| 6,261,337 B1 | 7/2001 | Kumar |
| 6,328,927 B1 | 12/2001 | Lo et al. |
| 6,331,233 B1 | 12/2001 | Turner |
| 6,408,928 B1 | 6/2002 | Heinrich et al. |
| 6,444,259 B1 | 9/2002 | Subramanian et al. |
| 6,464,933 B1 | 10/2002 | Popoola et al. |
| 6,482,743 B1 | 11/2002 | Sato |
| 6,491,208 B2 | 12/2002 | James et al. |
| 6,502,767 B2 | 1/2003 | Kay et al. |
| 6,521,173 B2 | 2/2003 | Kumar et al. |
| 6,558,447 B1 | 5/2003 | Shekhter et al. |
| 6,589,311 B1 | 7/2003 | Han et al. |
| 6,623,796 B1 | 9/2003 | Van Steenkiste |

(Continued)

FOREIGN PATENT DOCUMENTS

DE 10253794 A1 6/2004

(Continued)

OTHER PUBLICATIONS

"Cold Gas Dynamic Spray CGSM Apparatus," Tev Tech LLC, available at: http://www.tevtechllc.com/cold_gas.html (accessed Dec. 14, 2009).
Ajdelsztajn et al., "Synthesis and Mechanical Properties of Nanocrytalline Ni Coatings Producted by Cold Gas Dynamic Spraying," 201 Surface and Coatings Tech. 3-4, pp. 1166-1172 (Oct. 2006).
Gärtner et al., "The Cold Spray Process and its Potential for Industrial Applications," 15 J. of Thermal Sprsy Tech. 2, pp. 223-232 (Jun. 2006).
Hall et al., "The Effect of a Simple Annealing Heat Treatment on the Mechanical Properties of Cold-Sprayed Aluminum," 15 J. of Thermal Spray Tech. 2, pp. 233-238 (Jun. 2006).
Hall et al., "Preparation of Aluminum Coatings Containing Homogeneous Nanocrystalline Microstructures Using the Cold Spray Process," JTTEES 17:352-359, 2006.

(Continued)

Primary Examiner — Frederick Parker
(74) Attorney, Agent, or Firm — Bingham McCutchen LLP

(57) ABSTRACT

In various embodiments, sputter-target formation includes application of a layer having an intermediate coefficient of thermal expansion between the backing plate and the target material.

15 Claims, 22 Drawing Sheets

U.S. PATENT DOCUMENTS

| | | |
|---|---|---|
| 6,669,782 B1 | 12/2003 | Thakur |
| 6,722,584 B2 | 4/2004 | Kay et al. |
| 6,723,379 B2 | 4/2004 | Stark |
| 6,743,343 B2 * | 6/2004 | Kida et al. ............... 204/298.13 |
| 6,743,468 B2 | 6/2004 | Fuller et al. |
| 6,749,002 B2 | 6/2004 | Grinberg et al. |
| 6,759,085 B2 | 7/2004 | Muehlberger |
| 6,770,154 B2 | 8/2004 | Koenigsmann et al. |
| 6,773,969 B2 | 8/2004 | Lee et al. |
| 6,780,458 B2 | 8/2004 | Seth et al. |
| 6,855,236 B2 | 2/2005 | Sato et al. |
| 6,872,425 B2 | 3/2005 | Kaufold et al. |
| 6,872,427 B2 | 3/2005 | Van Steenkiste et al. |
| 6,896,933 B2 | 5/2005 | Van Steenkiste et al. |
| 6,905,728 B1 | 6/2005 | Hu et al. |
| 6,911,124 B2 | 6/2005 | Tang et al. |
| 6,915,964 B2 | 7/2005 | Tapphorn et al. |
| 6,919,275 B2 | 7/2005 | Chiang et al. |
| 6,924,974 B2 | 8/2005 | Stark |
| 6,953,742 B2 | 10/2005 | Chen et al. |
| 6,962,407 B2 | 11/2005 | Yamamoto et al. |
| 7,053,294 B2 | 5/2006 | Tuttle et al. |
| 7,067,197 B2 | 6/2006 | Michaluk et al. |
| 7,081,148 B2 | 7/2006 | Koenigsmann et al. |
| 7,101,447 B2 | 9/2006 | Turner |
| 7,108,893 B2 | 9/2006 | Van Steenkiste et al. |
| 7,128,988 B2 | 10/2006 | Lambeth |
| 7,143,967 B2 | 12/2006 | Heinrich et al. |
| 7,163,715 B1 | 1/2007 | Kramer |
| 7,164,205 B2 | 1/2007 | Yamaji et al. |
| 7,170,915 B2 | 1/2007 | McDonald |
| 7,175,802 B2 | 2/2007 | Sandlin et al. |
| 7,178,744 B2 | 2/2007 | Tapphorn et al. |
| 7,183,206 B2 | 2/2007 | Shepard |
| 7,192,623 B2 | 3/2007 | Andre et al. |
| 7,208,230 B2 | 4/2007 | Ackerman et al. |
| 7,244,466 B2 | 7/2007 | Van Steenkiste |
| 7,278,353 B2 | 10/2007 | Langan et al. |
| 7,335,341 B2 | 2/2008 | Van Steenkiste et al. |
| 7,399,335 B2 | 7/2008 | Shekhter et al. |
| 7,402,277 B2 | 7/2008 | Ayer et al. |
| 7,479,299 B2 | 1/2009 | Raybould et al. |
| 7,514,122 B2 | 4/2009 | Kramer |
| 7,582,846 B2 | 9/2009 | Molz et al. |
| 7,618,500 B2 | 11/2009 | Farmer et al. |
| 7,670,406 B2 | 3/2010 | Belashchenko |
| 7,910,051 B2 * | 3/2011 | Zimmermann et al. ........ 419/61 |
| 8,002,169 B2 | 8/2011 | Miller et al. |
| 8,043,655 B2 | 10/2011 | Miller et al. |
| 2002/0112789 A1 | 8/2002 | Jepson et al. |
| 2003/0190413 A1 | 10/2003 | Van Steenkiste et al. |
| 2003/0219542 A1 | 11/2003 | Ewasyshyn et al. |
| 2003/0232132 A1 | 12/2003 | Muehlberger |
| 2004/0037954 A1 | 2/2004 | Heinrich et al. |
| 2004/0065546 A1 | 4/2004 | Michaluk et al. |
| 2004/0076807 A1 | 4/2004 | Grinberg et al. |
| 2004/0126499 A1 | 7/2004 | Heinrich et al. |
| 2004/0202885 A1 | 10/2004 | Seth et al. |
| 2005/0084701 A1 | 4/2005 | Slattery |
| 2005/0120957 A1 | 6/2005 | Kowalsky et al. |
| 2005/0147742 A1 | 7/2005 | Kleshock et al. |
| 2005/0153069 A1 * | 7/2005 | Tapphorn et al. ............. 427/180 |
| 2005/0155856 A1 | 7/2005 | Oda |
| 2005/0220995 A1 | 10/2005 | Hu et al. |
| 2005/0252450 A1 | 11/2005 | Kowalsky et al. |
| 2006/0027687 A1 | 2/2006 | Heinrich et al. |
| 2006/0032735 A1 | 2/2006 | Aimone et al. |
| 2006/0045785 A1 | 3/2006 | Hu et al. |
| 2006/0090593 A1 | 5/2006 | Liu |
| 2006/0121187 A1 | 6/2006 | Haynes et al. |
| 2006/0251872 A1 | 11/2006 | Wang et al. |
| 2007/0116886 A1 | 5/2007 | Refke et al. |
| 2007/0116890 A1 | 5/2007 | Adams et al. |
| 2007/0183919 A1 | 8/2007 | Ayer et al. |
| 2007/0196570 A1 | 8/2007 | Gentsch et al. |
| 2008/0028459 A1 | 1/2008 | Suh et al. |
| 2008/0078268 A1 | 4/2008 | Shekhter et al. |
| 2008/0145688 A1 | 6/2008 | Miller et al. |
| 2009/0004379 A1 | 1/2009 | Deng et al. |
| 2009/0239754 A1 | 9/2009 | Kruger et al. |
| 2009/0291851 A1 | 11/2009 | Bohn et al. |
| 2010/0015467 A1 | 1/2010 | Zimmermann et al. |
| 2010/0055487 A1 | 3/2010 | Zimmermann et al. |
| 2010/0061876 A1 | 3/2010 | Miller et al. |
| 2010/0084052 A1 | 4/2010 | Farmer et al. |
| 2010/0086800 A1 | 4/2010 | Miller et al. |
| 2010/0136242 A1 | 6/2010 | Kay et al. |
| 2010/0172789 A1 | 7/2010 | Calla et al. |
| 2010/0189910 A1 | 7/2010 | Belashchenko |
| 2010/0246774 A1 | 9/2010 | Lathrop |
| 2010/0272889 A1 | 10/2010 | Shekhter et al. |
| 2011/0132534 A1 | 6/2011 | Miller et al. |
| 2011/0300396 A1 | 12/2011 | Miller et al. |
| 2011/0303535 A1 | 12/2011 | Miller et al. |

FOREIGN PATENT DOCUMENTS

| | | | |
|---|---|---|---|
| EP | 0074803 | A1 | 3/1983 |
| EP | 0484533 | A1 | 5/1992 |
| EP | 0774315 | A2 | 5/1997 |
| EP | 1066899 | A2 | 1/2001 |
| EP | 1138420 | A2 | 10/2001 |
| EP | 1350861 | | 10/2003 |
| EP | 1382720 | A2 | 1/2004 |
| EP | 1398394 | | 3/2004 |
| EP | 1413642 | A1 | 4/2004 |
| EP | 1452622 | | 9/2004 |
| EP | 1715080 | | 10/2006 |
| GB | 2121441 | A | 12/1983 |
| GB | 2394479 | A | 4/2004 |
| JP | 54067198 | | 5/1979 |
| JP | 3197640 | | 8/1991 |
| JP | 06346232 | | 12/1994 |
| JP | 11269639 | | 10/1999 |
| JP | 01/131767 | | 5/2001 |
| JP | 03/301278 | | 10/2003 |
| RU | 2166421 | | 5/2001 |
| WO | WO-9837249 | | 8/1998 |
| WO | WO-0112364 | A1 | 2/2001 |
| WO | WO-02064287 | A2 | 8/2002 |
| WO | WO-02/070765 | | 9/2002 |
| WO | WO-03/062491 | | 7/2003 |
| WO | WO-03106051 | A1 | 12/2003 |
| WO | WO-2004074540 | A1 | 9/2004 |
| WO | WO-2005/073418 | | 8/2005 |
| WO | WO-2005/079209 | | 9/2005 |
| WO | WO-2006/117144 | | 11/2006 |
| WO | WO-2006/117145 | | 11/2006 |
| WO | WO-2007/001441 | | 1/2007 |
| WO | WO-2008/063891 | | 5/2008 |
| WO | WO-2008/089188 | | 7/2008 |

OTHER PUBLICATIONS

IPRP in International Patent Application No. PCT/EP2006/003967, dated Nov. 6, 2007 (15 pages.

IPRP in International Patent Application No. PCT/EP2006/003969, mailed dated Nov. 6, 2007 (13 pages).

International Search Report and Written Opinion in International Patent Application No. PCT/US2007/087214, mailed Mar. 23, 2009 (13 pages).

IPRP in International Patent Application No. PCT/US2007/081200, dated Sep. 1, 2009 (17 pages).

IPRP in International Patent Application No. PCT/US2007/080282, dated Apr. 7, 2009 (15 pages).

Irissou et al., "Review on Cold Spray Process and Technology: Part I—Intellectual Property," 17 J. of Thermal Spray Tech. 4, pp. 495-516 (Dec. 2008).

Karthikeyan, "Cold Spray Technology: International Status and USA Efforts," ASB Industries, Inc. (Dec. 2004).

Li et al., "Effect of Annealing Treatment on the Microstructure and Properties of Cold-Sprayed Cu Coating," 15 J. of Thermal Spray Tech. 2, pp. 206-211 (Jun. 2006).

Marx et al., "Cold Spraying—Innovative Layers for New Applications," 15 J. of Thermal Spray Tech. 2, pp. 177-183 (Jun. 2006).

Morito, "Preparation and Characterization of Sintered Mo-Re Alloys," 3 J. de Physique 7, Part 1, pp. 553-556 (1993).

Search Report in European Patent Application No. 09172234.8, dated Jan. 29, 2010 (7 pages).
Stoltenhoff et al., "An Analysis of the Cold Spray Process and its Coatings," 11 J. of Thermal Spray Tech. 4, pp. 542-550 (Dec. 2002).
Van Steenkiste et al., "Analysis of Tantalum Coatings Produced by the Kinetic Spray Process," 13 J. of Thermal Spray Tech. 2, pp. 265-273 (Jun. 2004).
Examination Report in European Patent Application No. 09172234.8, mailed Jun. 16, 2010 (3 pages).
IPRP in International Patent Application No. PCT/US2008/062434, dated Nov. 10, 2009 (21 pages).
Examination Report in European Patent Application No. 07843733.2, mailed Nov. 30, 2010 (9 pages).
English Translation of Office Action mailed Feb. 23, 2011 for Chinese Patent Application No. 200880023411.5 (4 pages).

Kosarev et al., "Recently Patented Facilities and Applications in Cold Spray Engineering," Recent Patents on Engineering, vol. 1 pp. 35-42 (2007).
For U.S. Appl. No. 11/913,579, the Office Action mailed Dec. 23, 2011.
For U.S. Appl. No. 12/444,263, the Office Action mailed Dec. 19, 2011.
For U.S. Appl. No. 12/206,944, the Office Action mailed Oct. 26, 2011.
For U.S. Appl. No. 13/184,665, the Notice of Allowance mailed Oct. 5, 2011.
U.S. Appl. No. 13/343,113, filed Jan. 4, 2012 by Miller et al.
Examination Report in European Patent Application No. 08755010.9, mailed Sep. 16, 2011 (3 pages).

* cited by examiner

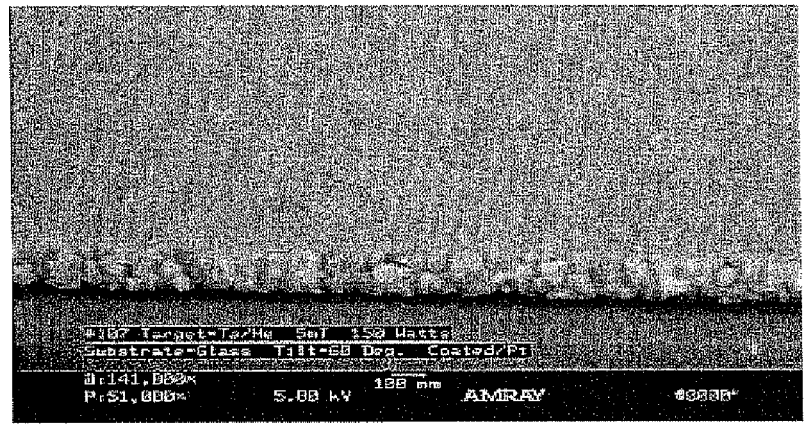
FIGURE 3A
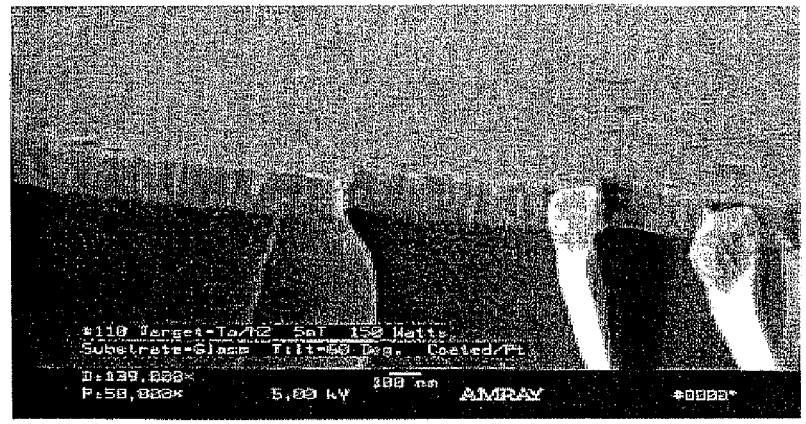
FIGURE 3 B
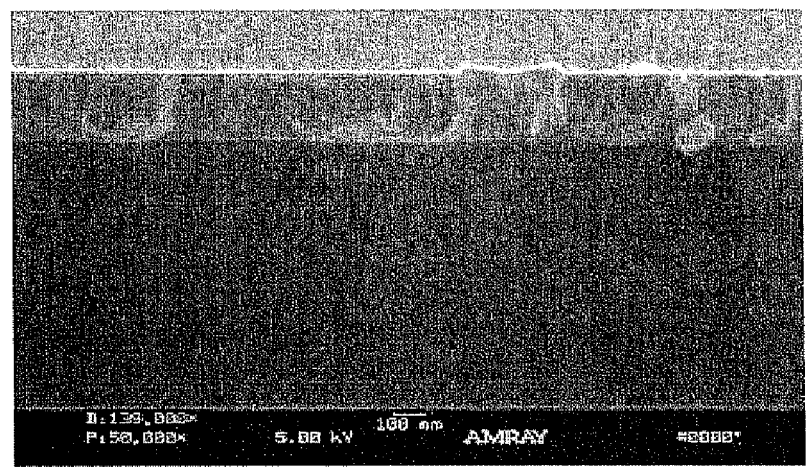
FIGURE 3 C SEM micrographs of sputtered tantalum thin films from targets prepared by helium cold spray, nitrogen cold spray and rolled billet.

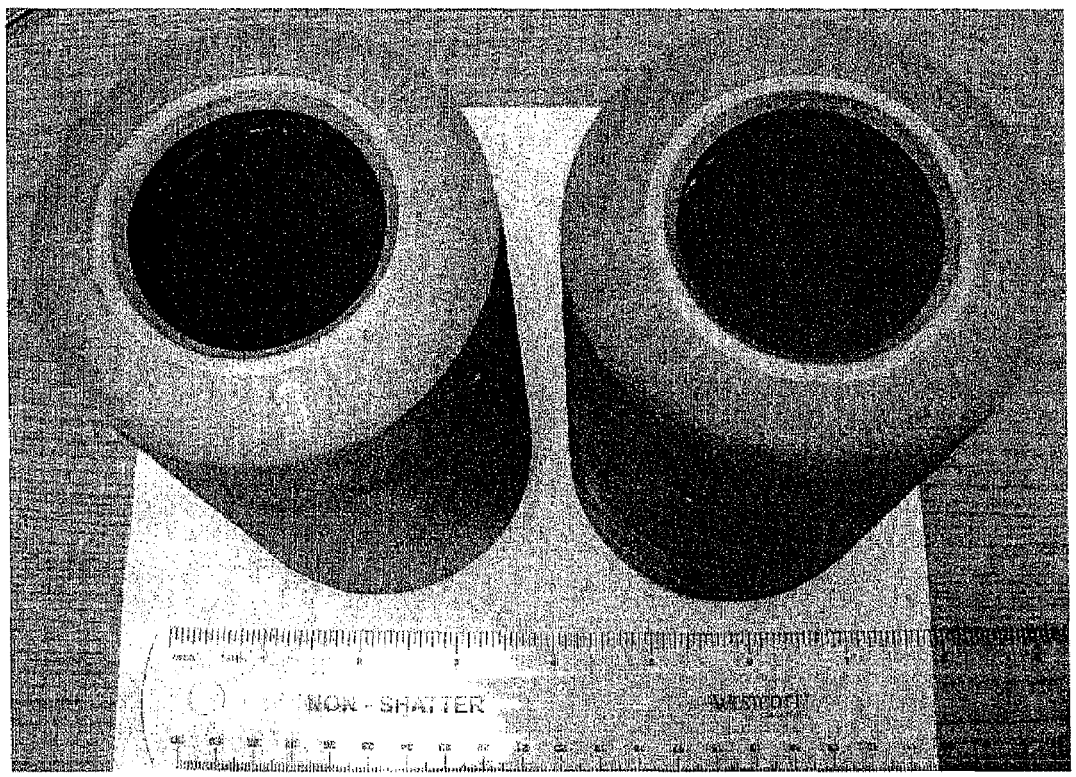
FIGURE 5. Tantalum tubular preforms

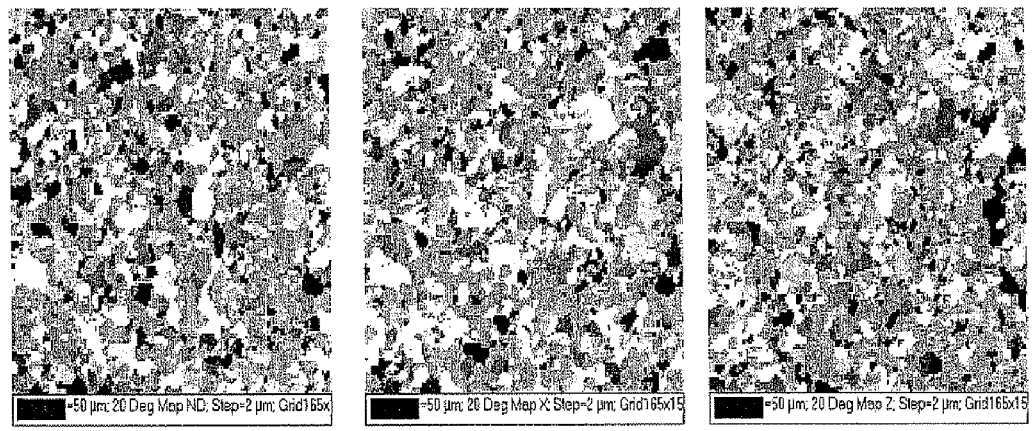
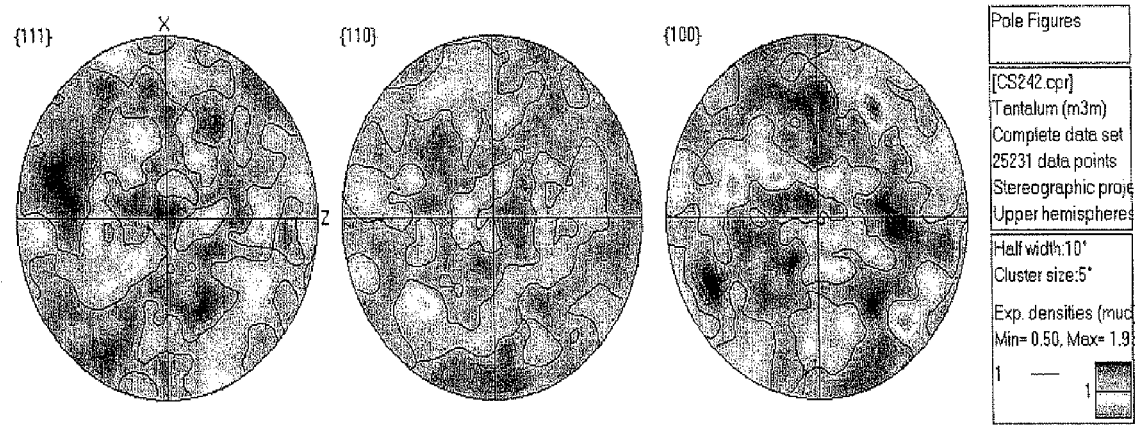
FIGURE 8 – Results Cold spray, annealed at 1150 C

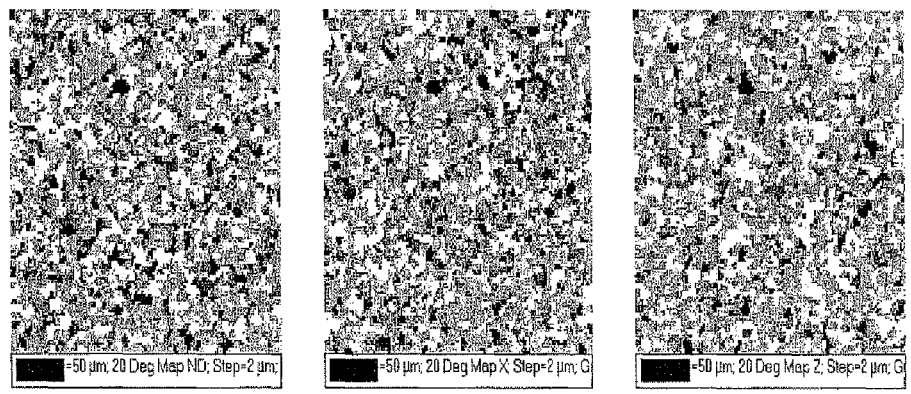
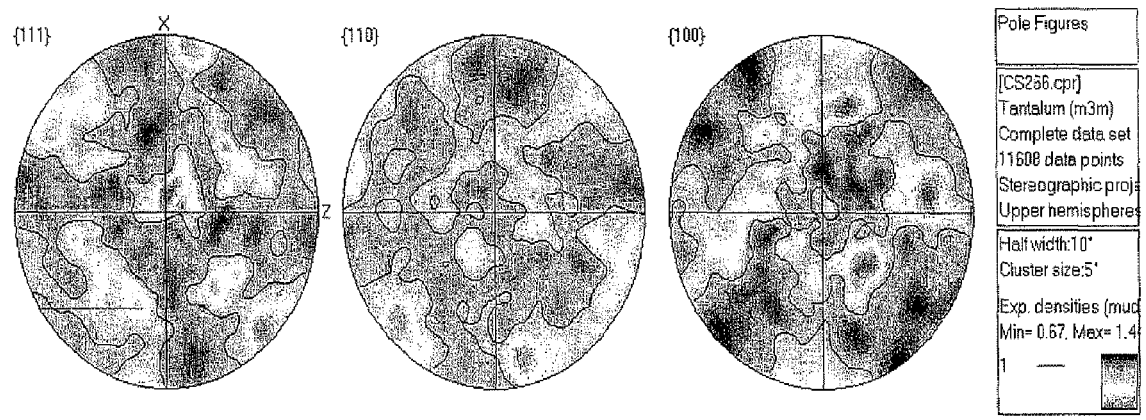
FIGURE 9 – Results Cold spray, annealed at 942 C

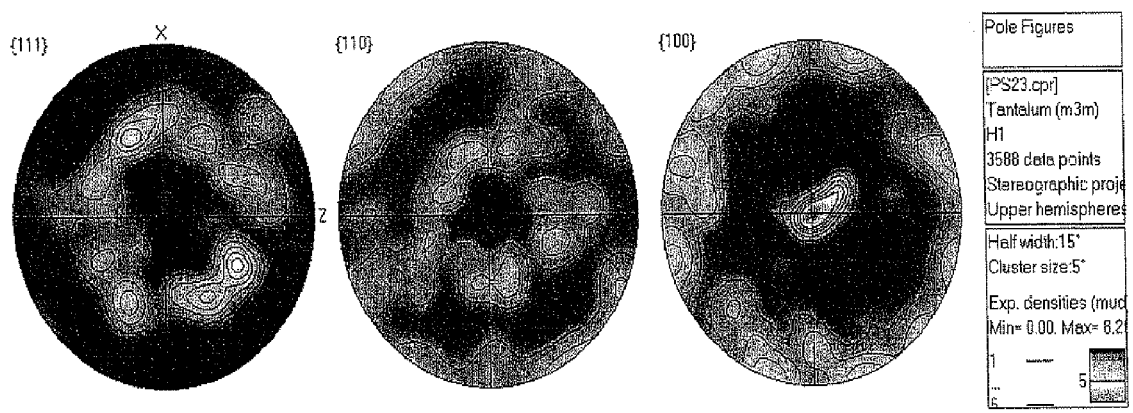
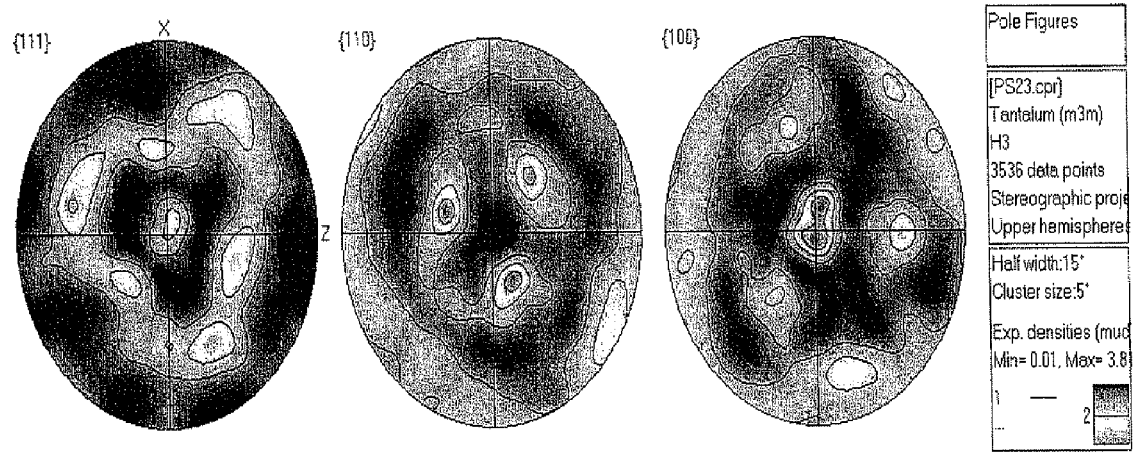
FIGURE 13

FIGURE 14 Cold Sprayed TaNb target. Deposit is over 440 mm long, 110 mm wide and 7 mm thick. Note 3 mm bow induced at center of the copper backing plate FIGURE 15 Load vs. deflection for as sprayed Tantalum. Note the deposit fails by brittle fracture, without exhibiting any plastic deformation.

FIGURE 16. Permanent set obtained in Ta deposit after 0.08 inches of deflection during bend test.

FIGURE 17 Target after annealing and straightening. Straight edge ruler demonstrates the bow has been successfully removed

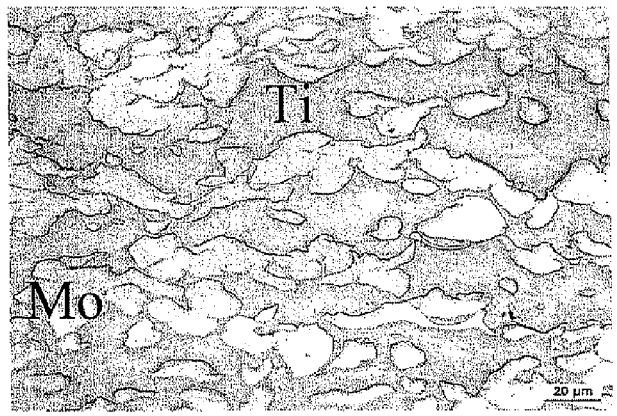
FIGURE 24
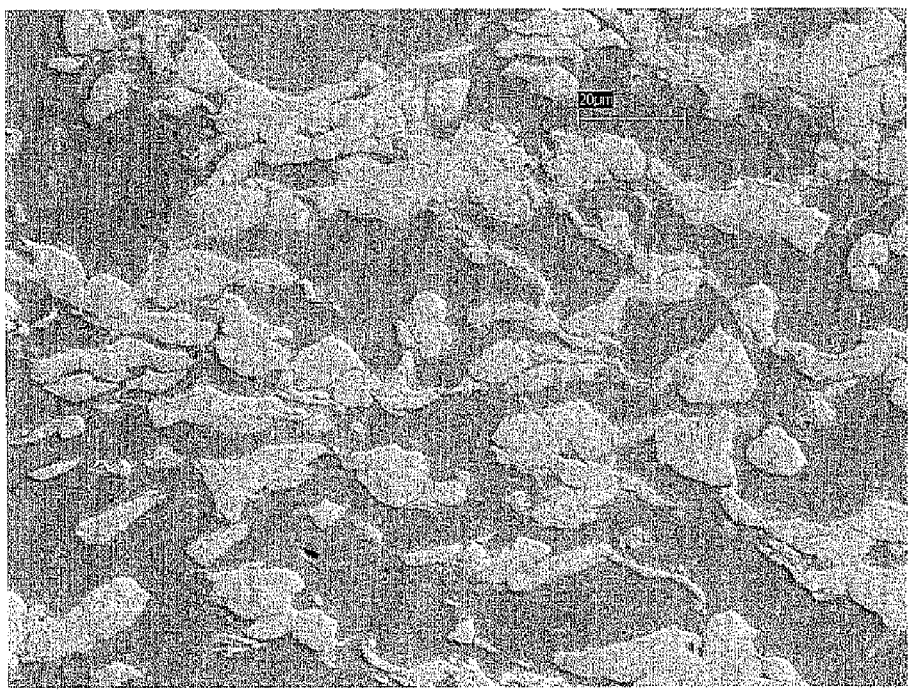
FIGURE 25 Cold sprayed MoTi after a 700 C 1.5 hour anneal showing that substantially no deleterious phase has been formed

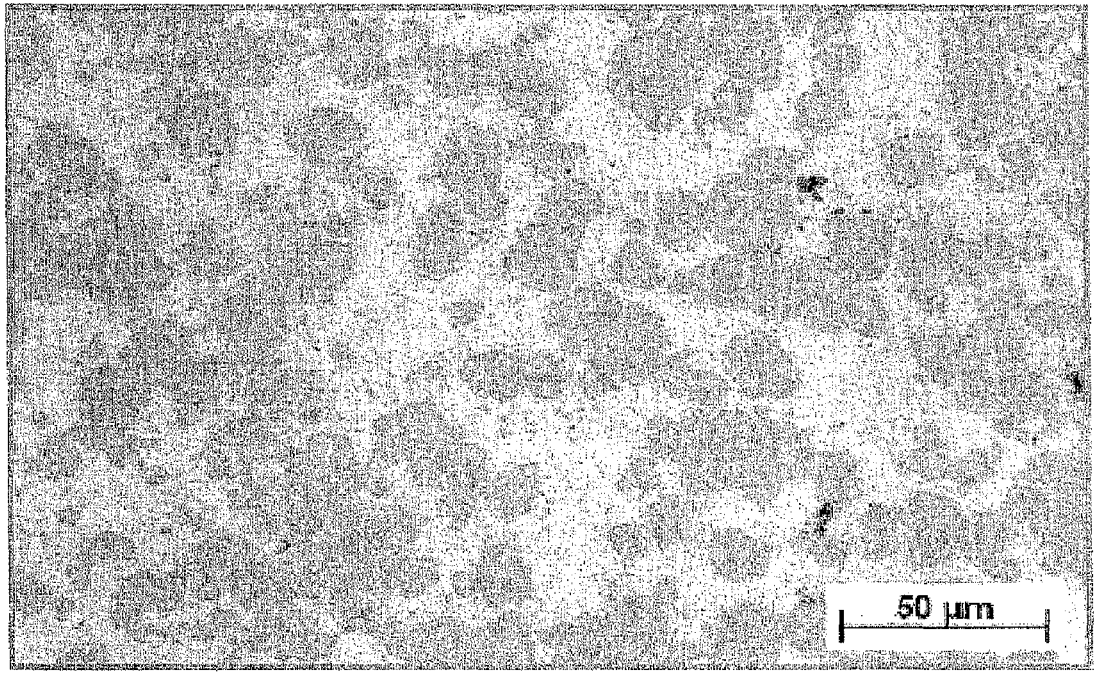
FIGURE 26 A
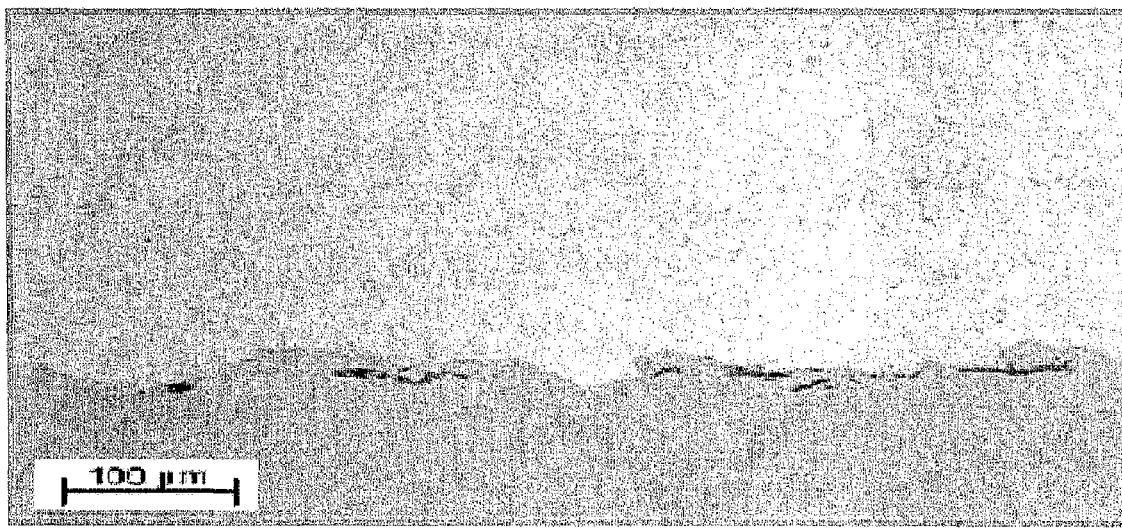
FIGURE 26 B The Cu has a flattened structure

METHODS OF FORMING SPUTTERING TARGETS

RELATED APPLICATIONS

The application claims benefit to U.S. provisional application 60/915,967 filed May 4, 2007, which is incorporated by reference in its entirety for all useful purposes.

BACKGROUND

It is well known in the art that the physical properties of sputtering targets employed for Physical Vapor Deposition (PVD) in the electronics industry greatly influence the final properties of the thin films produced. In fact the target properties that enable and enhance the manufacture of high quality thin film devices and circuitry are:

Fine and uniformly fine grain structure.

Random and uniformly random crystallographic orientation of the individual grains.

A microstructure that when viewed on the macroscale is substantially invariant throughout the entire body of the target A microstructure that can be repeated from target to target.

A microstructure that is substantially 100% dense and provides high strength intergranular bonding.

These properties are in particular very difficult to attain in tantalum (Ta)_and niobium (Nb) targets. This results from the fact that high purity Ta and Nb are refined and purified via electron beam melting and casting into a cold, water cooled mold. The ingot formed has many extremely large grains measured in multiples of centimeters in both width and length. These extremely large grains require extensive and expensive thermomechanical processing in order to reduce the grain size and reduce the crystallographic alignment of the individual grains (reduce the texture). Thermomechanical processing has limits in the reduction in grain size, crystallographic randomness produced, and the uniformity of microstructure produced. Typically tantalum target material produced from ingot still contains a large degree of nonuniformity described as grain size and texture banding-regions where there is a common grain size and texture that is not typical of the overall grain size and texture of the entire target.

The importance and magnitude of this problem was addressed in U.S. Pat. No. 6,193,821 where ingots were first side forged or side rolled followed by upset forging or upset rolling. U.S. Patent Publication No. 2002/0112789 A1 describes a process utilizing upset forging followed by draw back forging then side forging and finally a cross rolling process to provide a mix of grains with the {100} and {111} orientation. In U.S. Pat. Nos. 6,331,233 and 7,101,447 the inventor specified a complex three step process consisting of multiple deformation and annealing components. But while the complex processing route successfully refined grain size the processing still resulted in a predominantly {111} texture.

US Patent Publication No. 2005/0155856 A1 describes a Ta sputtering target which has a preferential (222) orientation over a limited portion of the target thickness which it is claimed improves the uniformity of the sputtered film thickness.

Other patents recognize the inherent advantages of starting with tantalum metal powder rather than a solid tantalum ingot. U.S. Pat. Nos. 5,580,516 and 6,521,173 describes cold compact Ta powder into billets that then may undergo a wide range of thermal/mechanical process techniques in order to produce fully dense billets from which sputtering targets can be made. U.S. Pat. No. 6,770,154 describes consolidating a powder billet to full density followed by rolling and annealing to provide a uniform but not random grain structure. U.S. Pat. No. 7,081,148 expands upon the processes of U.S. Pat. No. 6,770,154 to include a resultant tantalum sputtering target that is at least 99.99% pure tantalum.

U.S. Pat. No. 7,067,197 describes a powder metallurgy process that first surface nitrides the tantalum powder before compaction. The surface nitride powder may then be compacted by a list of at least 23 different processing steps that must retain the high nitrogen content of the powder. One of the least favorable is spray depositing, although no mention of what type of spray deposition technology is being used i.e. plasma spray, low pressure plasma deposition, flame spray, high velocity oxyfuel, etc. a few of the many processes currently employed.

WO 2006/117145 and WO 2006/117144 describe cold spray processes for producing coatings of tantalum.

The rejuvenation or reprocessing or repair of used targets is also of economical interest due to the fact that tantalum and the processes for bonding tantalum to backing plates are quite expensive. This is compounded by the fact that only about 25-30% of a planar target and 60-70% of a rotary target is used in sputtering before the entire target must be replaced. Thus the recovery of the unused Ta is of much interest.

U.S. Patent Publication No. 2004/0065546 A1 discloses a method of hydriding the tantalum target so that the tantalum is embrittled allowing it to be separated from the backing plate, ground up, and reused as a powder stock in making ingots. U.S. Patent Publication No. 2006/0032735 discusses the use of laser beams and other focused energy sources in order to simultaneously melt and fuse powder that is fed into the worn areas of a used target in order to fill the void created by the sputtering. Of course all these techniques generate substantial heat and require the backing plate be removed from the target prior to repair. Additionally, as is well known to one of ordinary skill in the art, when melting occurs the powders resolidify by directional manner and the resulting microstructure has strong textural components.

Before a target can be used it must be machined to final dimensions and then soldered, brazed or diffusion bonded to a high thermal conductivity backing plate for mounting in the sputtering machine.

Sputtering targets are used to make a wide range of thin films with applications ranging from reflective and low emissivity coatings for window glass (Nb), photovoltaic films (Mo), narrow pass filters (TaNb) etc. Perhaps their best known use however is in integrated circuitry where layered sputtered films are used to make the basic switching devices as well as the circuitry to connect them producing functional electronic components (integrated circuits, flat panel displays, etc.). As stated above the quality of the thin films made and hence the quality of the products made using thin film technology, are highly dependent on the quality of the target they are sputtered from.

Cold spray or kinetic spray (see U.S. Pat. Nos. 5,302,414, 6,502,767 and 6,759,085; Van Steenkiste et al, "Analysis of Tantalum Coatings Produced by the Kinetic Spray Process" Journal of Thermal Spray Technology, Vol. 13 (2) June 2004 pages 265-273, U.S. Pat. No. 6,139,913, and U.S. Publication Nos. 20050120957 and 20050252450) is an emerging industrial technology that is being employed to solve many industrial manufacturing challenges (see, also e.g., U.S. Pat. Nos. 6,924,974; 6,444,259; 6,491,208 and 6,905,728).

Cold spray employs a high velocity gas jet to rapidly accelerate powders, typically less than approximately 44 microns in size, to high velocity such that when they impact a surface the powders bond to the surface to form an integral, well bonded and dense coating. The cold spraying of tantalum powders onto a variety of substrates (including steel) has been suggested (see, e.g., "Analysis of Tantalum Coatings Produced by the Kinetic Spray Process," Van Steenkiste et al, Journal of Thermal Spray Technology, volume 13, number 2, June 2004, pages 265-273; "Cold spraying—innovative layers for new applications," Marx et al, Journal of Thermal Spray Technology, volume 15, number 2, June 2006, pages 177-183; and "The Cold Spray Process and Its Potential for Industrial Applications," Gartner et al, Journal of Thermal Spray Technology, volume 15, number 2, June 2006, pages 223-232). This is all accomplished without having to heat the powder to a temperature near or above its melting point as is done with traditional thermal spray processes. The fact that dense coatings can be formed at low temperatures present many advantages. Such advantages include lack of oxidation, high density deposits, solid state compaction, the lack of thermally induced stresses and particularly, in this case, the lack of substantial substrate heating.

Kinetic spray can be accomplished for example, by injecting Ta starting powders having particle diameters great than 65 μm into a de Laval-type nozzle, entrained in a supersonic gas stream and accelerated to high velocities due to drag effects. The particle's kinetic energy is transformed via plastic deformation into strain and heat on impact with the substrate surface. The particles are melted in the process.

Limited substrate heating is preferred in the instance of manufacturing cathode or electronic sputtering target blanks for the field of Physical Vapor Deposition (PVD). Target materials are frequently high melting temperature ("TM") refractory metals (Ta TM=2998 C) while the backing plate that supports the target is chosen for its high thermal conductivity and is typically copper or aluminum (Al TM=660 C), both low melting temperature materials. Thus other thermal spray processes that require heating of the powder to at or near its melting point can not be used to deposit refractory metals on the low melting temperature backing plate. Current practice is to make the target completely separate from the backing plate and then use solder, brazing, diffusion bonding or explosive bonding techniques in order to bond the target and backing plate together. Because cold or kinetic spray does not substantially heat the powder it can be used to make targets directly on the backing plate as well as repair used targets without the need of having to remove the target from the backing plate.

A BRIEF SUMMARY OF THE INVENTION

It is an object of the invention to manufacture a sputtering target that has a uniformly fine and crystallographically random microstructure throughout the entire body of the target.

It is a further object of the invention to provide a manufacturing process that can cost effectively create such a microstructure, and repeat that structure from target to target. Preferably, the process does not require melting. Examples of such processes include cold spray or kinetic spray processes.

It is a further object of the invention to provide a cost effective repair or rejuvenation process that gives the repaired target the same or better microstructure as it originally had.

It is a further object to develop a target rejuvenation process by a method that does not require melting such as cold spray or kinetic spray.

We have discovered a technique and parameters that allow direct fabrication of targets with a fine, randomly oriented grain structure, through the entire thickness of the target without the complex processing described above, a technique that allows the manufacture of targets directly on the backing plate with the desired microstructure and for used targets to be repaired simply. That technique does not use a melting process. Examples of such processes include cold spray or kinetic spraying of fine metal powders such as, but not limited to tantalum powder.

Additionally, the present invention provides a method of sputtering, whereby any of the above-described sputtering targets are subjected to sputtering conditions and are thereby sputtered. Any suitable sputtering method can be used in the present invention. Suitable sputtering methods include, but are not limited to, magnetron sputtering, pulse laser sputtering, ion beam sputtering, triode sputtering, and combinations thereof.

Additionally, the present invention provides a sputtering target which comprises a fine uniform grain structure of essentially less than 44 microns, that has no preferred texture orientation (i.e. consists essentially of randomly orientated grains) as measured by electron back scattered diffraction ("EBSD"), consists essentially of less than 44 micron grains, and that displays no grain size or texture banding throughout the body of the target.

Additionally, the present invention provides a target which comprises an equiaxed grain size in annealed state, grain size smaller than starting powder particle size.

Additionally, the present invention provides a sputtering target with a lenticular grain structure characterized by substantially no interparticle diffusion that has no preferred texture orientation as measured by EBSD and that displays no grain size or texture banding throughout the body of the target.

Additionally, the present invention provides a process for manufacturing a sputtering target assembly in an additive manner by depositing the target materials via a powder spray directly upon the backing plate used in the target assembly, machining of that deposit and substrate to final target assembly dimensions in a single step.

The present invention also provides a method of making a thin film including the steps of:

(a) sputtering the above-described sputtering target;

(b) removing metal atoms from the target; and (c) forming a thin film comprising the above metal onto a substrate.

BRIEF DESCRIPTION OF THE FIGURES

FIG. 3 illustrates scanning electron microscope ("SEM") micrographs of sputtered tantalum thin films from targets prepared by helium cold spray, nitrogen cold spray and rolled billet.

FIG. 5 illustrates tantalum tubular performs according to the invention.

FIG. 8 illustrates results using cold spray and annealed at 1150 C.

FIG. 9 illustrates results using cold spray and annealed at 942 C.

FIG. 13 illustrates pole figures according to the invention.

FIG. 24 illustrates the microstructure of an as sprayed MoTi target produced by cold spray that contains only elemental Mo and elemental Ti and no deleterious phase formation.

FIG. 25 illustrates cold sprayed MoTi after a 700 C 1.5 hour anneal showing that substantially no deleterious phase has been formed compared to a hot isostatic pressing ("HIPed") target (FIG. 23).

FIG. 26A illustrates the microstructure of W—Cu (50/50 vol %).

FIG. 26B illustrates Cu that has a flattened structure.

DESCRIPTION OF THE INVENTION

Figure 1:
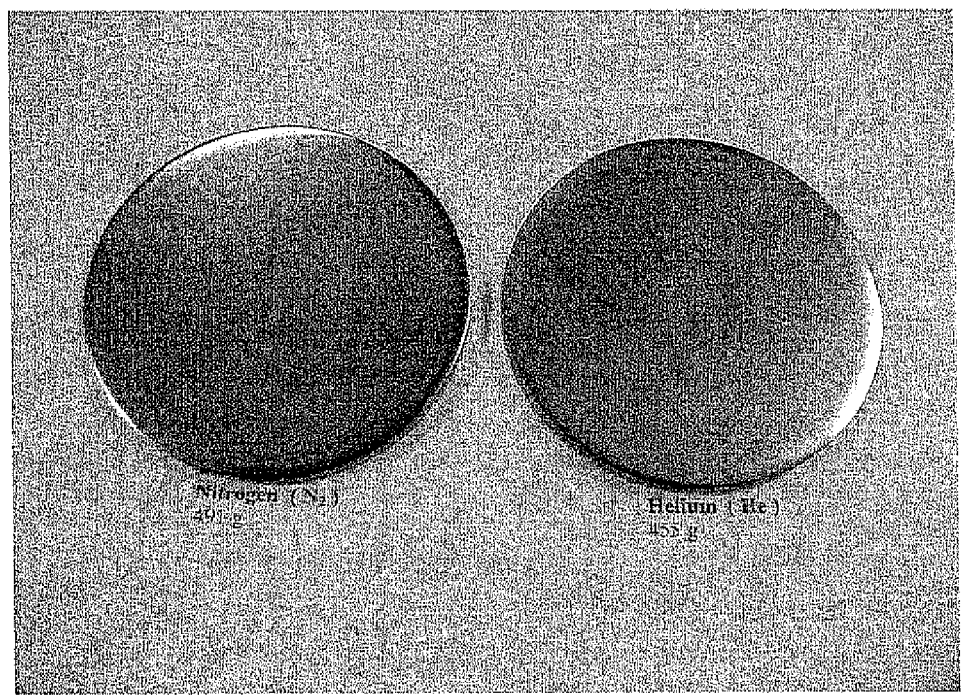
FIG. 1 illustrates flat planar tantalum targets made by cold spraying using nitrogen gas and helium gas.

We have discovered a technique and parameters that allow direct fabrication of targets without the complex processing described above, a technique that allow the manufacture of targets directly on the backing plate with the desired microstructure and used targets to be repaired simply with or without the prior removal of the used target from the backing plate. That technique does not use a melting process. Examples of such processes include cold spray or kinetic spraying of fine metal powders such as, but not limited to tantalum powder.

The technique can also be used for regenerating or the repair of a sputtering target.

As the gas with which the metal powder forms a gas-powder mixture there is generally used an inert gas. Inert gas according to the invention includes, but is not limited to argon, helium, or relatively non-reactive nitrogen or mixtures of two or more thereof. In particular cases, air may also be used. If safety regulations are met, also the use of hydrogen or mixtures of hydrogen with other gases would be considered and can be used advantageously due to hydrogen's extremely high sonic velocity. In fact hydrogen's sonic velocity is 30% greater than that of helium which in turn is approximately 3 times that of nitrogen. The air sonic velocity is 344 m/s at 20 C and 1 atmosphere (atm), while hydrogen with molecular weight 2.016 is the lightest element, compared to air's molecular weight of 28.96. Its density is about 14 times less than air and has a sonic velocity of 1308 m/s.

In one preferred version of the process the spraying comprises the steps of:

providing a spraying orifice adjacent a surface to be coated by spraying;

providing to the spraying orifice a powder of a particulate material chosen from the group consisting of niobium, tantalum, tungsten, molybdenum, titanium, zirconium, mixtures of at least two thereof or alloys thereof with one another or other metals, the powder having a particle size of 0.5 to 150 μm, preferably 5 to 80 μm and most preferably 10 to 44 μm said powder being under pressure;

providing an inert gas at an elevated stagnation pressure to the spraying orifice and providing a spray of said particulate material and gas onto a substrate surface to be coated;

locating the spraying orifice in a region of low ambient pressure;

which is substantially less than the stagnation pressure before the spraying orifice to provide substantial acceleration of the spray of said particulate material and gas onto said surface to be coated and whereby the substrate is coated with a densified coating on said coating is annealed. It is noted that the densified coating maybe removed from the substrate before or after annealing.

In another preferred version of the process the spraying is performed with a cold spray gun and the target to be coated and the cold spray gun are located within an inerted chamber at pressures below 80 kPa, or above 0.1 Mpa.

Throughout the application the term cold spray is used. It is understood that it is possible to use a kinetic spray process instead of the cold spray process in the instances only a cold spray process is referred to.

In another preferred version of the process the spraying is performed with a kinetic device. The kinetic process produces coating using larger particle size distribution between 65 and 200 μm and higher particle temperatures, compared to cold spray process using particle diameters less than 50 μm with higher particle velocities and usually lower particle temperatures. Since the kinetic energy is proportional to cube of particle diameter, and square of particle velocity, the total kinetic energy, available for plastic deformation, is usually greater than that of cold spray process. The kinetic spray is performed with a longer nozzle length after the throat region (such as 280 mm vs standard 80 mm), and higher gas temperature (for example higher than 200 C, but much below the material's melting point). The higher particle velocities improve the coating properties resulting in a high degree of plastic deformation, increased adhesion, lower porosity and higher work hardening compared with coatings produced with shorter nozzle.

In general, the refractory metal has a purity of at least 99%, such as 99.5% or 99.7%, 99.9%, advantageously has a purity of at least 99.95%, based on metallic impurities, especially of at least 99.995% or of at least 99.999%, in particular of at least 99.9995%.

In general if an alloy is used instead of a single refractory metal, then at least the refractory metal, but preferably the alloy as a whole, has that purity, so that a corresponding highly pure coating can be produced.

In one of the embodiments according to the invention the the total content of non-metallic impurities in powders, such as oxygen, carbon, nitrogen or hydrogen, should advantageously be less than 1,000 ppm, preferably less than 500 ppm, and more preferably less than 150 ppm.

In one of the embodiments according to the invention, the oxygen content is 50 ppm or less, the nitrogen content is 25 ppm or less and the carbon content is 25 ppm or less.

The content of metallic impurities is advantageously 500 ppm or less, preferably 100 ppm or less and most preferably 50 ppm or less, in particular 10 ppm or less.

Such metal powders can be purchased commercially or can be prepared by reduction of refractory metal compound with a reducing agent and preferably subsequent deoxidation. Tungsten oxide or molybdenum oxide, for example, is reduced in a stream of hydrogen at elevated temperature. The preparation is described, for example, in Schubert, Lassner, "Tungsten', Kluwer Academic/Plenum Publishers, New York, 1999 or Brauer, "Handbuch der Präparativen Anorganischen Chemie",Ferdinand Enke Verlag Stuttgart, 1981, p 1530.

In the case of tantalum and niobium, the preparation is in most cases carried out by reducing alkali heptafluoro-tantalates and earth alkaline metal heptafluoro-tantalates or the oxides, such as, for example, sodium heptafluorotantalate, potassium heptafluorotantalate, sodium heptafluoroniobate or potassium heptafluoroniobate, with an alkali or alkaline earth metal. The reduction can be carried out in a salt melt with the addition of, for example, sodium, or in the gas phase, calcium or magnesium vapor advantageously being used. It is also possible to mix the refractory metal compound with the alkali or alkaline earth metal and heat the mixture. A hydrogen atmosphere may be advantageous. A large number of suitable processes is known to the person skilled in the art, as are process parameters from which suitable reaction conditions can be selected. Suitable processes are described, for example, in U.S. Pat. No. 4,483,819 and WO 98/37249.

If a low oxygen content is desired, a further process for preparing pure powder having a low oxygen content consists in reducing a refractory metal hydride using an alkaline earth metal as reducing agent, as disclosed, for example, in WO 01/12364 and EP-A-1200218.

The invention moreover relates to a process for reprocessing of a sputter target (source of metal in cathode sputtering of metal), wherein a gas flow forms a gas/powder mixture with a powder of a material chosen from the group consisting of niobium, tantalum, tungsten, molybdenum, titanium, zirconium or mixtures of two or more thereof or alloys thereof with at least two thereof or with other metals, the powder has a particle size of 0.5 to 150 microns, wherein a supersonic speed is imparted to the gas flow and the jet of supersonic speed is directed on to the surface of the object to be reprocessed or produced.

A sputter target is a source of metal in the cathode sputtering of metal. These are employed in the production of integrated circuits, semiconductors and other electrical, magnetic and optical products. During the sputtering process, in general the metal surface of the sputter target is worn away non-uniformly, which leads to a furrow on the surface. To avoid contamination with the material of the backing plate or even a catastrophic breakthrough of cooling liquid, the sputter targets are not used until the refractory metal target is used up, but are taken out of service promptly beforehand, so that only a relatively small amount of the expensive refractory metal is used up when a new sputter target must be employed. The majority can merely be sold as scrap, or their materials recycled, since removal of the backing plate is required and connection to a new refractory metal plate is necessary. The backing plate here, however, is the part of the sputter target which is of lower value.

There is therefore a need for a technique which either renders possible reprocessing of or rejuvenating a sputter target without having to detach the backing plate for this or which renders possible to deposit the sputter material direct to the backing plate or for a rotary target backing tube.

For this purpose, the furrow in a used sputter target is topped up again with the particular refractory metal. It is preferably done without the use of melting. It can be done for example, by the cold spray or kinetic process, as described above. For this, the jet of supersonic speed of the gas/powder mixture is directed on to the furrow and moved over the complete length and shape of the furrow. This is repeated as often as is necessary to top up the furrow again, so that the surface of the sputter target forms a substantially flat area again and/or the topped-up material is raised slightly above the surface of the sputter target. Preferably, the jet of supersonic speed of the gas/powder mixture is then directed on to the remaining surface of the sputter target and guided over the complete length, breadth and shape of the sputter target surface until a uniformly thick and flat layer which completely covers the surface of the sputter target has been obtained. The rough surface obtained can then be ground and polished by the conventional processes, so that the desired smooth surface is obtained.

We note that if the original target was made by conventional ingot metallurgy or powder metallurgy techniques the cold sprayed repair will have a finer grain size and more random structure than the original target. If the original target were made by cold spray the repair will have a similar if indistinguishable microstructure from the original target. There will however be a distinct boundary line between the original target and the repaired zone that is visable in cross section of the target.

During production of a new sputter target, the target is applied directly to a backing plate. Depending upon the construction of the target the jet of supersonic speed of the gas/powder mixture is therefore either directed on to the complete surface of the backing plate of the sputter target and guided over the complete length, breadth and shape of the sputter target surface, until a uniformly and sufficiently thick and flat layer which completely covers the surface of the sputter target has been obtained or only the contact area of the plasma is coated which results in a considerable saving of material.

Preferred are targets with a thickness between 2 and 20 mm, more preferred between 3.0 and 15 mm, still more preferred between 5 and 12 mm, still more preferred between 8 and 10 mm, The purities and oxygen contents of the targets obtained should deviate not more than 5% and preferably not more than 1% from those of the powder.

This can advantageously be achieved if the sputter target to be reprocessed is coated under an inert gas. Argon is advantageously used as the inert gas, because of a higher density than air, it tends to cover the object to be coated and to remain present, especially if the sputter target is in a vessel which prevents the argon from escaping or flowing out and argon is topped up continuously. Other inert gases that work according to the invention are discussed above.

The process according to the present invention is particularly suitable for the processing or production of sputtering targets, because on the one hand during production by thermomechanical processes crystallographic preferred orientations which can change at different intervals often occur, so that no uniform texture is obtained and instead so-called bands, that is to say regions of different preferred orientations occur. In thermomechanical processes, this can be prevented only with very complicated and expensive processes. In contrast, a uniformly random texture in which there is no detectable preferred orientations present over the thickness of the refractory metal target, may be obtained by the process according to the invention.

A uniform and random particle size distribution and grain size distribution is likewise obtained in the targets, so that also no bands of different particle size or grain size are obtained if this is not desired. Banding in grain size or texture in sputtering targets is particularly bad as it results in variations of the sputter rate and film uniformity.

In processes in which powder is applied to the sputter target and melted, experience shows that bubbling and grain growth occurs. This also cannot be observed in the process according to the invention.

After application of the target, the surface of the sputter target is usually ground and polished in order to obtain a suitable smooth surface. This can be carried out by the conventional processes according to the prior art.

In the production of a new sputter target, the target is applied to a backing means, e.g. to a backing plate. This plate is in general a plate of copper or aluminum or an alloy of at least one of these metals with beryllium. This backing plate can contain channels in which there is a cooling medium.

The backing plate and therefore also the sputter target can be in the form of a flat, rod, cylinder, block or any other desired shape. Additional structural components liquid cooling coils and/or a larger coolant reservoir and/or complex flanges or other mechanical or electrical structures can also be attached.

The targets which are fabricated according to the invention, or targets which are produced during production or reprocessing of a sputter target, can have a high purity and a low oxygen content.

The resultant target has a content of gaseous impurities which deviates not more than 50%, or not more than 20%, or not more than 10%, or not more than 5%, or not more than 1% from the content of the starting powder with which this target has been produced. In this context, the term deviation is to be understood as meaning, in particular, an increase; the targets obtained should thus advantageously have a content of gaseous impurities which is not more than 50% above the content of the starting powder The powder densified on the surface preferably has an oxygen content which deviates not more than 5%, in particular not more than 1% from the oxygen content of the starting powder.

In an advantageous embodiment, the targets moreover have a density of at least 97%, preferably greater than 98%, in particular greater than 99% or 99.5%. The density of the target here is a measure of the closed nature and porosity of the target. 97% density of a target means that the target has a density of 97% of the bulk material. A closed, substantially pore-free target always has a density of more than 99.5%. The density can be determined either by image analysis of a cross-section image (cross-section) of such a target, or by helium pyknometry. The latter method is preferred less, since in the case of very dense targets, pores present in targets further-removed from the surface are not detected and a lower porosity than is actually present is therefore measured. The density can be determined by image analysis by first determining the total area of the target to be investigated in the image section of the microscope, and then relating this area to the areas of the pores. Pores which are far-removed from the surface and close to the interface to the substrate are also recorded by this means. A high density of at least 97%, preferably greater than 98%, in particular greater than 99% or 99.5% is important in particular in the production or reprocessing of sputter targets.

The targets show high mechanical strength which is caused by their high density and by the high deformation of the particles, in the case of tantalum, the strengths are therefore at least 80 MPa, more preferably at least 100 MPa, most preferably at least 140 MPa if nitrogen is the gas with which the metal powder forms a gas/powder mixture. This mechanical strength and ductility of the sprayed powder can be further increased by providing an annealing or diffusion bonding heat treatment after spraying.

If helium is used, the strength usually is at least 150 MPa, preferably at least 170 MPa, most preferably at least 200 MPa and very most preferred greater than 250 MPa.

The present invention also provides a method of making a thin film including the steps of:

(a) Making the desired sputtering target by cold spray or kinetic spray (b) sputtering the above-described sputtering target;

(c) removing metal atoms from the target; and (d) forming a thin film comprising metal atoms onto a substrate.

The metal atoms according to the invention include, but are not limited to niobium, tantalum, tungsten, molybdenum, titanium, zirconium, chromium, vanadium, magnesium, tin, lead, aluminum, zinc, copper, rhodium, silver, gold, cobalt, iron, ruthenium, rhenium, gallium, indium, antimony, mixtures of two or more thereof or alloys of two or more thereof or alloys with other metals which have the abovementioned properties. Depending on the application of the thin film would dictate which metal or combination of metal atoms are used in making the sputtering target.

In another embodiment of the invention, after (c), a step can be added which includes supplying a reactive gas to the metal atoms. A reactive gas is a gas that includes a component that can react with the metal atoms either in a gaseous state or once deposited onto a substrate to form a metal or alloy compound. As a non-limiting example, the reactive gas can be oxygen, nitrogen and/or a silicon containing gas.

The thin film applied by the present method can have any desired thickness. The thickness of the thin film will depend on the end use application desired. Typically, the thickness of the thin film can be at least 0.5 nm, in some situations at least 1 nm, in some cases at least 5 nm, in other cases at least 10 nm, in some situations at least 25 nm, in other situations at least 50 nm, in some circumstance at least 75 nm and in other circumstances at least 100 nm. Also, the film thickness can be up to 10 µm, in some cases up to 5 µm, in other cases up to 2 µm, in some situations up to 1 µm and in other situations up to 0.5 µm. The film thickness can be any of the stated values or can range between any of the values stated above. The advantage of the thin film according to the invention is that the thin film can have an excellent uniformity and very small surface roughness. Surprisingly, under similar magnetron sputtering conditions, the thin film's non-uniformity made from cold-sprayed tantalum target ranges from 1.5% -4%, compared to 4.3% -15.4% film non-uniformity made from conventional ingot-rolled tantalum target (as shown in Table 1). The improved thin film uniformity is the result of cold spray target exhibiting features of randomly uniform texture and fine grain size substantially smaller than 44 µm.

The use of the thin film according to the invention encompasses products used in various applications. In one embodiment, a thin film made in accordance with the invention can be used in thin film transistor (TFT)-liquid crystal display (LCD) applications. Also, in another embodiment, the invention encompasses a thin film used in solar cell applications, sensor applications, semiconductor devices and metal gates for CMOS technology (complementary metal oxide semiconductor). In one embodiment, the invention is directed to a TFT-LCD device containing molybdenum thin films that serve as gate electrodes that have excellent uniformity. Another embodiment is directed to thin film solar cell applications, where the invention encompasses solar cells in which Mo thin films function as a back contact as well as barrier layer. The thin film can be used in ink-jet printing head application (for example, tantalum is used as a heating element (a highly corrosion resistant metal material), a cavitation barrier, and a passivation layer (as $Ta_2O_5$) providing a higher electric breakdown), or architectural glass coatings, the thin film can be or be part of a flat panel display, or a magnetic thin film material as disk-drive storage, and optical coatings. The thin film according to the invention can replace the conventional thin film according to the prior art.

Due to the uniformity of grain size and texture through the thickness of the metal sputtering targets, the films obtained from such targets have excellent uniformity, as the cold-sprayed target is "fine-grained, non-banded with random grain orientation.

Solar cell devices are well known in the art. For example, the following patents for solar cell devices (molybdenum thin film as barrier layer as well as back-end contact): U.S. Pat. No. 7,053,294 (Thin Film Solar Cell Fabricated on a Flexible Metallic Substrate), U.S. Pat. No. 4,915,745 (Thin Film Solar Cell and Method of Making), The Fabrication and Physics of High-efficiency CdTe Thin Film Solar Cells (by Alvin, Compaan and Victor Karpov, 2003, National Renewable Energy Lab), and Development of Cu(In, Ga)Se2 Superstrate Thin Film Solar Cells (by Franz-Josef Haug, 2001, Ph.D. thesis of Swiss Federal Institute of Technology Zurich).

Generally, a solar cell can include:
A) a cover glass,
B) a top electric contact layer,
C) a transparent contact,
D) a top junction layer,
E) an absorber layer,
F) a back electric contact, and
G) a substrate.

According to the invention a thin film is made by using sputtering target as made by the kinetic or cold spray process as discussed above. The sputtering target is preferably a powder blending at least one powder from the following metals: tantalum, niobium, molybdenum, aluminum, zinc, tellurium, copper or gold. The film according to the invention can be used as a back electric contact as well as barrier layer.

According to the invention to make a semiconductor device, a sputtering target is made by the kinetic or cold spray process as discussed above. The sputtering target is made by the cold spray with preferably a powder blending at least one powder from the following metals, Ta, Nb, Mo, W, Cr, Ti, Hf, and Zr. The thin film made from such target is used as barrier layer. The use of the barrier layers are well known in the art, For example, Semiconductor Carrier film, and Semiconductor Device and Liquid Crystal Module Using The Same (U.S. Pat. No. 7,164,205), Methods of forming an interconnect on a semiconductor substrate (U.S. Pat. No. 5,612,254), Fabrication of Semiconductor device (tungsten, chromium or molybdenum, and barrier layer) (U.S. Pat. No. 7,183,206) all disclose semiconductor devices.

A semiconductor device with thin films made according to the invention using a cold spray or kinetic process include titanium, tantalum niobium, tungsten, chromium, hafnium and zirconium, and their nitrides, silicides or oxy-silicides films. These films can be used as a barrier layer and can replace the conventional tantalum films. For example, the following patents describe Ta barrier layers: Tantalum Barrier Layer for Copper Metallization (U.S. Pat. No. 6,953,742), Method of Preventing Diffusion of Copper through a Tantalum-comprising Barrier Layer (U.S. Pat. No. 6,919,275), and Method of Depositing a TaN seed Layer (U.S. Pat. No. 6,911,124).

Magnetic thin film material according to the invention is made by using sputtering target made by kinetic or cold spray processes as discussed above. The sputtering target is made by cold spray with preferably a composite powder blending at least two powders from at least the following metals, platinum, cobalt, nickel, chromium, iron, niobium, zirconium, born elements. This magnetic film material can be used for hard disk storage device and magnetic random access memory (MRAM) in place of the conventional magnetic thin film material. The conventional magnetic thin film materials are well known in the art: For example, Magnetic Materials Structures, Devices and Methods (U.S. Pat. No. 7,128,988), Method and Apparatus to Control the Formation of Layers useful in Integrated Circuits (U.S. Pat. No. 6,669,782), Magnetic Recording Medium and Method for Its Production (U.S. Pat. No. 5,679,473), Magnetic Recording Medium (U.S. Pat. No. 4,202,932). Hard Disk Drive are well known in the art.

Optical coatings are well known in the art: For example, the following patents disclose optical coatings: optical reflector for reducing radiation heat transfer to hot engine parts (U.S. Pat. No. 7,208,230), Thin layer of hafnium oxide and deposit process (U.S. Pat. No. 7,192,623) Anti-reflective (AR) coating for high index gain media (U.S. Pat. No. 7,170,915). According to the invention optical coatings are made by using the thin film according to the invention. The sputtering target is made by the kinetic or cold spray processes as discussed above. The sputtering target is made from hafnium, titanium or zirconium. The oxide material is hard pressed on the sputtering target. The oxide film can be made by reactive magnetron sputtering of target discussed above to replace the conventional oxide thin film sputtered from target made by either vacuum hot press or hot isostatic press process.

Ink-jet printing head (containing tantalum) are well known in the art: According to the invention an ink-jet printing head is made by using the thin film according to the invention. The sputtering target is made by the kinetic or cold spray process as discussed above. The sputtering target is made from tantalum or niobium. The film was made by reactive sputtering with silane and/or oxygen, which can replace the tantalum-silicon-oxygen corrosion resistance film as described in U.S. Pat. No. 6,962,407. For example, Inkjet recording head, method of manufacturing the same, and inkjet printer (U.S. Pat. No. 6,962,407), Print head for Ink-Jet Printing A method for Making Print Heads (U.S. Pat. No. 5,859,654).

TFT-OLED (thin-film transistor organic light-emitting diode) Device Structure for Flat Panel Display are well known in the art. According to the invention a thin film is made by using sputtering target that is made by the kinetic or cold spray processes as discussed above. The sputtering target is made from tungsten, chromium, copper, or molybdenum. The film as gate layer sputtered from the cold spray target can replace the conventional thin film layer in the TFTT-OLED. For example, TFT-OLED are described in U.S. Pat. No. 6,773,969.

TFT-LCD (thin-film transistor Liquid Crystal Display for Flat Panel Display) the liquid display crystal comprises:
A) a glass substrate,
B) a source electrode,
C) a drain electrode,
D) a gate insulator,
E) a gate electrode, F) an amorphous-silicon, polycrystaline-silicon or single crystal silicon layer,
G) an n-doped silicon layer,
H) a passivation layer,
I) a pixel transparent electrode,
J) a common electrode,
K) a polyimide alignment layer, and
L) a storage-capacitor electrode.

Where the gate electrode is metal such as Mo, W, Al etc.

Figure 18:
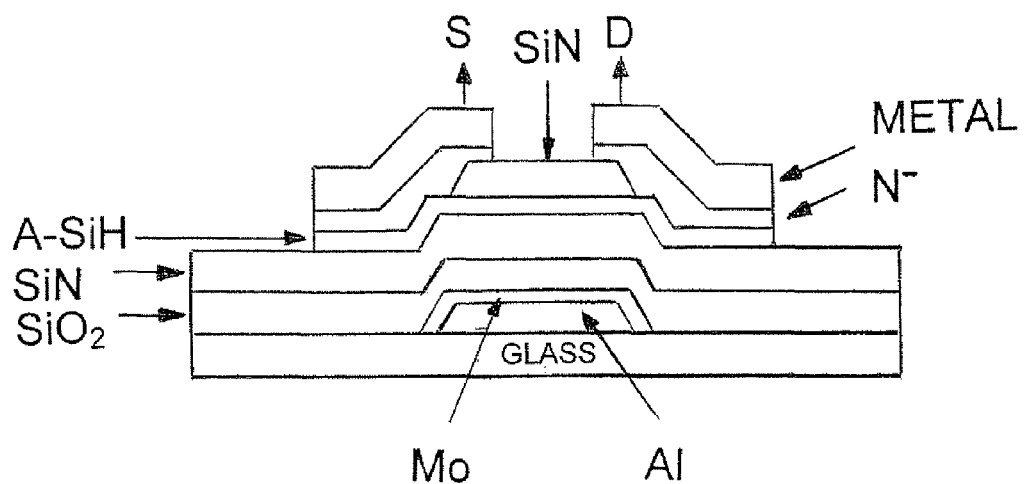
FIG. 18 illustrates a schematic view for TFT-LCD.
Figure 19:
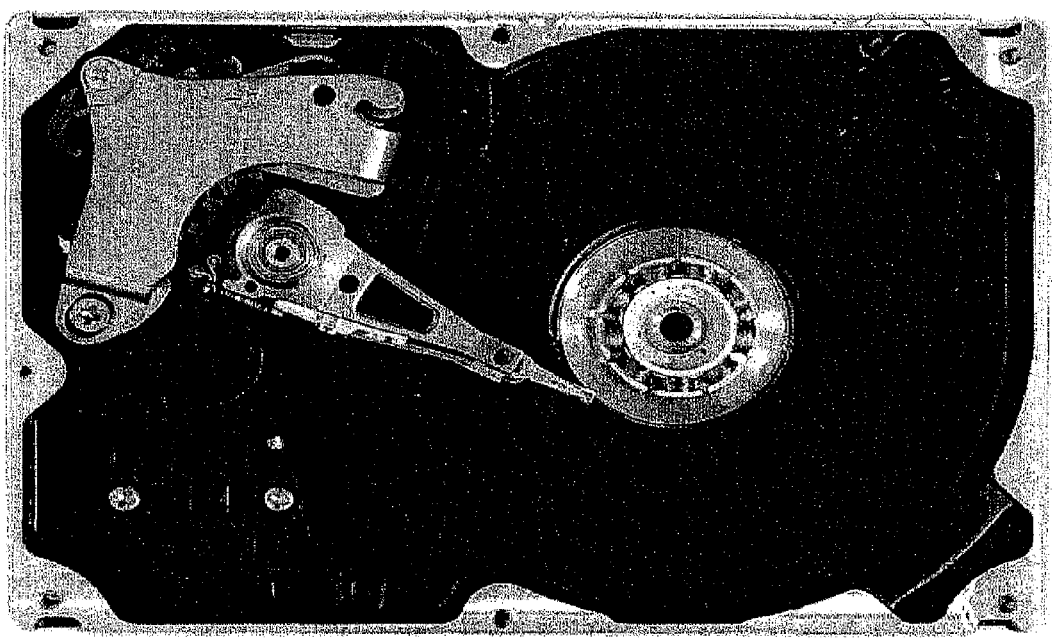
FIG. 19 illustrates an example of a hard disk drive.
Figure 20:
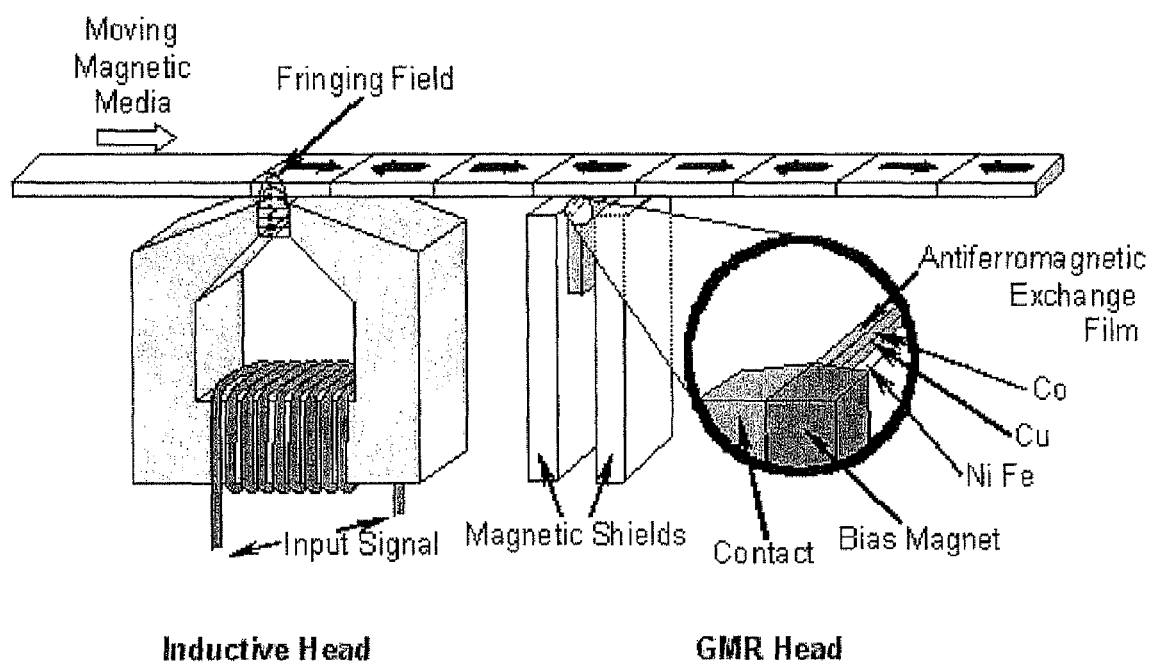
FIG. 20 illustrates a schematic of an inductive read/write head and a GMR read head.
Figure 21:
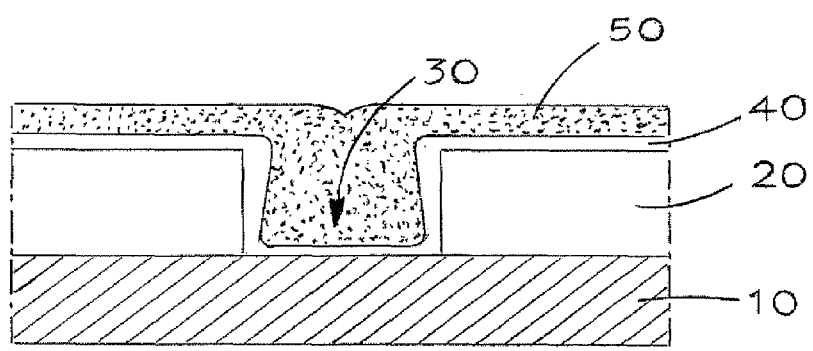
FIG. 21 illustrates the cross section diagram of a diffusion barrier layer of a semiconductor device.
Figure 22:
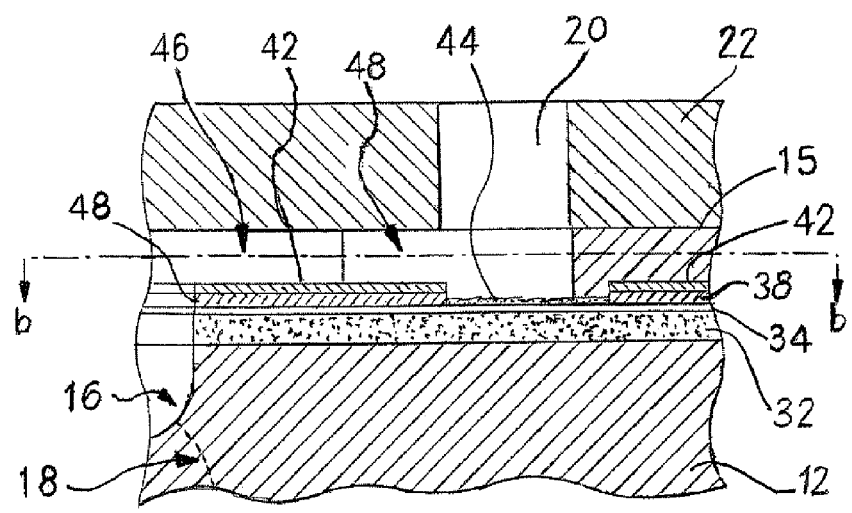
FIG. 22 illustrates a printer head according to the invention.

Another schematic for TFT-LCD, they use Al gate fully-capped with Mo to avoid the hillock formation of aluminum diffusion. Normally, the required thickness of Mo over layer to prohibit the hillock formation is about 300 A. The molybdenum fully-capped Al film with low resistivity (about 4.08 micro ohm-cm) was successfully integrated into amorphous-Si:H TFT fabrication with high performance. See FIG. 18. According to the invention a thin film is made by using sputtering target that is made by the kinetic or cold spray process as discussed above. The sputtering target is made from molybdenum, tungsten or aluminum. The film made from the sputtering target can replace the conventional aluminum and/or molybdenum layers in the TFT-LCD.

Due to the uniformity of grain size and texture through the thickness of the metal sputtering targets, the films obtained from such targets have excellent uniformity. The cold-sprayed target is "fine-grained, non-banded with random grain orientation.

In a particular embodiment of the invention a very thin film is provided. In this embodiment, the thin film is at least 100 Å, in some cases at least 250 Å and in other cases at least 500 Å. In this embodiment, the thin film can be up to 5,000 Å, in some cases up to 3,000 Å, in other cases up to 2,500 Å and in some situations up to 2,000 Å.

In addition to metal thin films on various substrates, MOx where M is metal (oxidation), MNx (nitridation), $MSi_{x\ x}$ (silicidation), and any combination thereof (such as $MO_xSi_y$ etc) can also be produced by reactive sputtering or ion implantation. The metal atoms according to the invention include, but are not limited to niobium, tantalum, tungsten, molybdenum, titanium, zirconium, chromium, vanadium, magnesium, tin, lead, aluminum, zinc, copper, rhodium, silver, gold, cobalt, iron, ruthenium, rhenium, gallium, indium, antimony, mixtures of two or more thereof.

Glass is not perfect with regard to a lot of applications, in particular for architectural use. On the one hand, its low reflection in the far infrared (room temperature radiation) causes undesired losses of thermal energy which is needed to heat buildings in colder climate regions. On the other hand, its high transmission in the near infrared (solar radiation) increases the energy necessary for cooling of buildings in hot climate zones.

Architectural Glass Coating are well known in the art: For example, D.C. reactively sputtered antireflection coatings (U.S. Pat. No. 5,270,858) Multilayer anti-reflection coating using zinc oxide to provide ultraviolet blocking (U.S. Pat. No. 5,147,125) Coated architectural glass system and method (U.S. Pat. No. 3,990,784) Electrically-conductive, light-attenuating antireflection coating (U.S. Pat. No. 5,091,244). According to the invention a thin film is made by using sputtering target that is made by the kinetic or cold spray process as discussed above. The sputtering target is made from zinc. During the sputtering of the zinc target, oxygen is introduced in the chamber (such as air or oxygen) thereby forming a zinc oxide thin film. The thin film made from the sputtering target can replace the conventional zinc oxide layer in the glass coating.

Carefully designed coatings on glass nowadays can overcome all these drawbacks. The purpose of these coatings is to control the energy transport through the glass for more efficient heating or air conditioning. The coatings are multilayers of metals and ceramics, whose exact compositions are tailored to specific needs. Heat reflecting so called low emissivity coatings permit a maximum amount of daylight to pass through, but then block the heat that is generated when light strikes an object (greenhouse effect).

The most important metal compounds for large area glass coating are, but not limited to, SiO2, SiN4, SnO2, ZnO, Ta2O5, Nb2O5 and TiO2. These thin film coatings can be obtained by reactive sputtering of Si, Sn, Ta, Nb and Ti metal targets. The sputtering targets are made by the kinetic or cold spray process as discussed above.

Other areas thin film according to the invention can be used are coatings such as optical coatings. Optical coatings includes reflective and antireflective materials, coating that provide selective transmission (i.e. filters), and non-linear optical application. Examples such as TiO2 thin film and Nb2O5 thin films are reactive sputtered from Ta and Nb sputtering targets.

For automobile application, coatings that transmit 70% of visible light and reflect 100% (or nearly) of the IR and UV, are needed to meet the goals set by automakers.

As stated above areas for the use of thin film include magnetic thin film materials. The impact of thin film materials science on disk-drive storage technology is a significant revolution, a transition from ferrite heads and particulate disks to thin film disks and heads. The future generation of film disks requires high coercivity and high induction. The thin film media must also be smooth and thinner than the present particulate surfaces to achieve higher recording densities. Perpendicular recording appears to be the most promising technology to achieve ultrahigh recording densities. Examples of magnetic thin film materials such as alloys of Co, Cr, Ni, Fe, Nb, Zr, B and Pt for storage applications. According to the invention a thin film is made by using sputtering target that is made by the kinetic or cold spray processes as discussed above. The sputtering target is made from composite of at least two of the following metals Co, Cr, Ni, Fe, Nb, Zr, B and Pt.

Also as stated above the thin film also include semiconductor applications. Tantalum is sputtered in an Ar-N2 ambient to form a TaN layer which is used as a diffusion barrier layer in between a Cu layer and a silicon substrate for semiconductor chips to ensure the interconnections using the high conductive Cu.

The present invention therefore also relates to sputter targets comprised of the refractory metals niobium, tantalum, tungsten, molybdenum, titanium, zirconium, chromium, vanadium, and rhenium with the metals magnesium, tin, lead, aluminum, zinc, copper, rhodium, silver, gold, cobalt, iron, ruthenium, gallium, indium, antimony, mixtures of two or more thereof or alloys of two or more thereof or alloys with other metals which have the above mentioned properties.

Preferably targets of tungsten, molybdenum, titanium zirconium or mixtures, of two or more thereof or alloys of two or more thereof or alloys with other metals, very preferably targets of tantalum or niobium, are applied by cold or kinetic spraying to the surface of a substrate to be coated. In said cold sprayed targets the oxygen content of the metal is nearly unchanged compared to the oxygen content of the powders. These cold or kinetic sprayed targets show considerably higher densities than targets produced by plasma spraying or by vacuum spraying. Furthermore, these cold or kinetic sprayed targets can be produced without any or with small texture, depending on powder properties and coating parameters.

Surprisingly it has been found that with decreasing oxygen content of the cold or kinetic sprayed target density and other properties of the sputtered thin film layers are improved. Oxygen in the sputter target affects the sputtering rate, and therefore the uniformity of thin film. For metallic thin film, oxygen is undesirable at high concentration due to its effect on the resistivity of the thin film.

We have invented a tantalum sputtering target and a means of manufacturing that tantalum target that has a fine uniform grain structure of essentially less than 44 microns, that has no preferred texture orientation as measured by electron back scattered diffraction ("EBSD") and that displays no grain size or texture banding throughout the body of the target and also has a reproducible microstructure from target to target. In addition we have invented a process for repairing such targets as well as certain hot isostatically pressed (HIPed) targets that completely reproduces the microstructure of the target before repair. When used to repair other targets of inferior microstructure, the repaired section has the improved microstructure as if the entire target had been made with this technique. The technique is not shape or material limited having been used to make planar, profiled and cylindrical targets and spray a range of target compositions.

Improvements on the invention include thermal treatments to improve interparticle bonding and stress reduction of the target, as well as designing the materials of the target assembly to minimize the effects of the as sprayed stresses and allow thermal treatment of the entire assembly to eliminate the disassembly step required with conventional backing plate materials.

Thermal Management Materials by Cold Spray Technology

The goal of these metal matrix composites is to produce a composite materials that maintains the high thermal conductivity of the metallic elements while adding the low thermal expansion coefficient of the Mo or W to reduce differential expansion and contraction of the heat sink relative to the silicon chip.

Traditional, the industry has developed WCu or MoCu metal matrix composites from either sintered Mo or W (called "Skeleton"), followed by infiltrated with molten Cu under temperature and pressure to create a metal matrix composite. The difficulty associated with this technique is that it is a costly operation. The infiltration temperatures are generally in the range of 800° C. or higher.

In addition, current WCu or MoCu composite heat sink manufacturing requires making W block first, slicing to an appropriate size, followed by Cu infiltration. Then end users need to further slice it to appropriate thickness & dimension. Cold spray can make ultra-thin, homogeneously distributed composite directly.

Cold Spray is a much less costly operation, compared to "sintering and infiltration" operation, as it is a direct route to fabricated parts from powder at temperature much below the melting points of the materials.

The following examples were prepared:

Example 1 is a planar tantalum sputter target fabrication, testing and thin film evaluation.

Two flat plates of Ta nominally ⅛" thick, 3.1" in diameter were cold sprayed with tantalum powder 15-38 microns in size (Amperit #151, special grade, commercially pure (>99.95 Ta) available from H.C. Starck Inc) to provide a total thickness of 0.300 inches. The gas, nitrogen in one case, helium in the other, was preheated to 600° C. and used at a stagnation pressure of 3 MPa. The powder and gas were sprayed using a Kinetiks gun commercially available from Cold Gas Technology GmbH, Ampfing, Germany. Post spraying the disk was machined to a nominal ¼" thickness and the sputter surface was polished before sputtering. (See FIG. 1). The targets went through a standard burn in procedure and then employed to make thin films using a DC magnetron sputtering unit using standard conditions.

Figure 2:
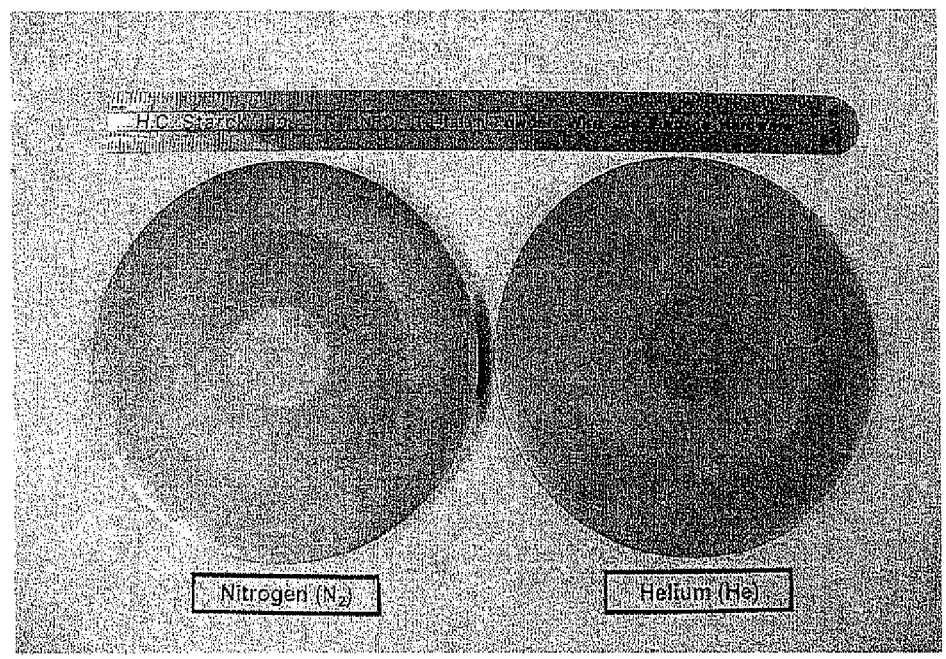
FIG. 2 illustrates flat planar tantalum targets made by cold spraying after sputtering.
Figure 4:
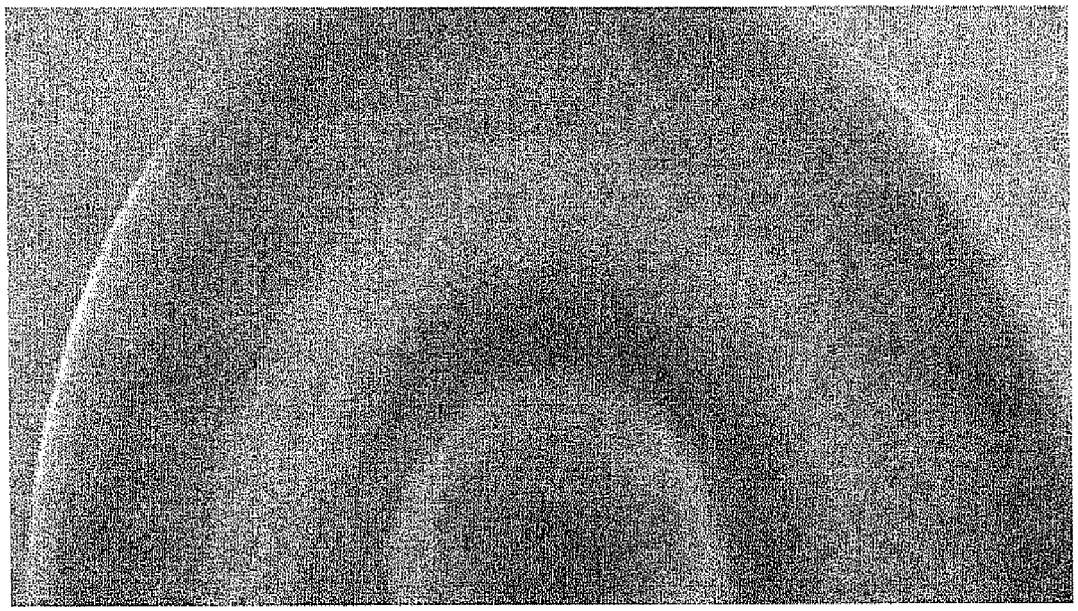
FIG. 4A illustrates close ups of rolled target after sputtering revealing mottled and irregular surface of the rolled target.
FIG. 4B illustrates close ups of helium cold sprayed target after sputtering revealing smoother, non mottled surface of the cold spray target.
Figure 4:

FIG. 2 shows the target surfaces post sputtering. For comparison purposes a standard rolled plate target was also sputtered under the same conditions. The measured properties of the films produced are shown in the table 1 below. Table 1 shows that the films produced from the cold sprayed targets have a better uniformity, a very attractive feature to integrated circuit ("IC") manufacturers as it allows lower film thicknesses to be employed, and smaller circuits to be etched in less time with less tantalum wastage in the process. Improved uniformity is essential to both electrical and physical properties and in the quest for reduced circuitry sizes on chips. This improved uniformity results directly from the very fine and random grain structure of a cold sprayed target compared to a conventional target This improved uniformity is directly relatable back to the used target surfaces shown in FIG. 4. FIG. 4 illustrates close ups of a rolled ingot metallurgy target (top) and He (helium) cold sprayed target (bottom). Post sputtering the rolled target had a mottled and irregular surface of the rolled target compared to the surface of the cold sprayed target. The smoother, non mottled surface of the cold spray target results from the more uniform non textured microstructure that in turn produces a more uniform sputtering rate and resulting film (see FIG. 3). Also shown in table one is that the Festivities and surface morphologies are similar for all three films. Thus, it may be concluded the cold sprayed targets produced sputtered films as good or better than conventional targets made from rolled ingots. FIG. 3 also shows that the films produced from the targets have different internal morphologies, with the helium sprayed target resulting in a columnar internal structure (FIG. 3A), with the helium sprayed target resulting in a equiaxed internal structure (FIG. 3B), and with the rolled target resulting in a relatively featureless internal structure (FIG. 3C).

Table 1. Properties of sputtered films.

TABLE 1

Properties of sputtered films.
Thin Film Properties

| Film # | Manufacture Process | Thickness(nm) | Average Thickness (nm) | Film Thickness Nonuniformty | Rs (Ohm/sq) | Resistivity (Ohm.cm) | Micro structure | Surface Morphology |
|---|---|---|---|---|---|---|---|---|
| 106 | CS He | 230,168,197 | 198 | 1.50% | 8.642 ± 2.4% | 1.71E−04 | | smooth |
| 107 | CS He | 157,170,170 | 166 | 3.40% | 10.281 ± 3.6% | 1.71E−04 | columnar | smooth |

TABLE 1-continued

Properties of sputtered films.
Thin Film Properties

| Film # | Manufacture Process | Thickness(nm) | Average Thickness (nm) | Film Thickness Nonuniformty | Rs (Ohm/sq) | Resistivity (Ohm.cm) | Micro structure | Surface Morphology |
|---|---|---|---|---|---|---|---|---|
| 109 | CS N2 | 288,288,227 | 268 | 3.50% | 8.713 ± 3.6% | 2.33E–04 | | smooth |
| 110 | CS N2 | 288,204,206 | 233 | 4.00% | 7.867 ± 4.0% | 1.83E–04 | equiaxed | smooth |
| 111 | rolled | | | 4.30% | 8.421 ± 4.4% | | | |
| 112 | rolled | | 244 | 5.00% | 7.878 ± 4.2% | 1.92E–04 | featureless | smooth |
| 113 | rolled | | | 15.40% | 4.120 ± 12% | | | |
| 114 | rolled | 275,248,230 | 251 | 7.40% | 6.761 ± 7.9% | 1.70E–04 | featureless | smooth |

Example 2

Tubular Tantalum Target Preforms Fabrication and Microstructural Analysis

Tubular tantalum performs (see FIG. 5) were fabricated using the same operational parameters of example 1. Samples were cut from the preforms and annealed at different temperatures. Then metallographic mounts were prepared and microstructural analysis performed on the as sprayed and annealed specimens. A summary of the properties is shown in Table 2. All samples came from a perform that used a powder having a starting median size of 15.9 microns (particle count based distribution) and approximately 26 microns (mass based distribution)

TABLE 2

Summary of microstructural properties of cold sprayed tantalum, as sprayed and with a subsequent anneal.

| Condition | As Deposited | Annealed 942 C. | Annealed 1150 C. | Annealed 1450 C. | HIP'd 1300 C. |
|---|---|---|---|---|---|
| Powder size (m) | 15.9 | 15.9 | 15.9 | 15.9 | 15.9 |
| Grain Size (m) | 12 | 12 | 6.7 | 10.6 | 5.5 |
| Grain Shape | Elongated | Elongated | Equiaxed | Equiaxed | Equiaxed |
| Recrystallized | No | No | Yes | Yes | Yes |
| Crystallographic Orientation | Random | Random | Random | Random | Random |

Figure 6A:
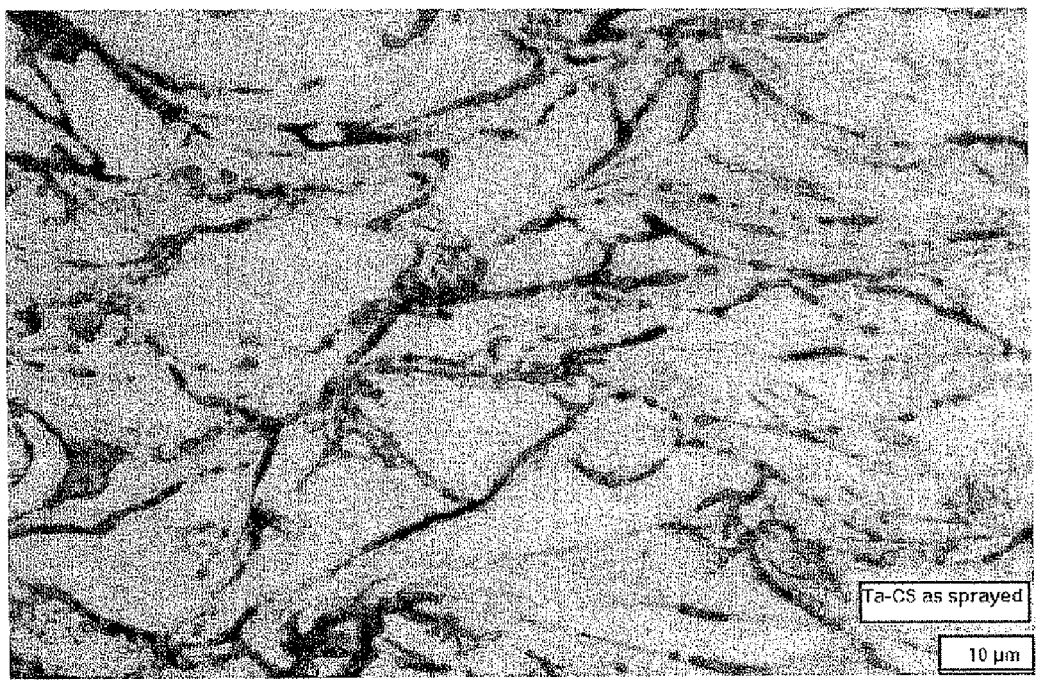
FIG. 6 illustrates micrographs of as sprayed and annealed structures taken normal to the direction of spray.
Figure 6B:
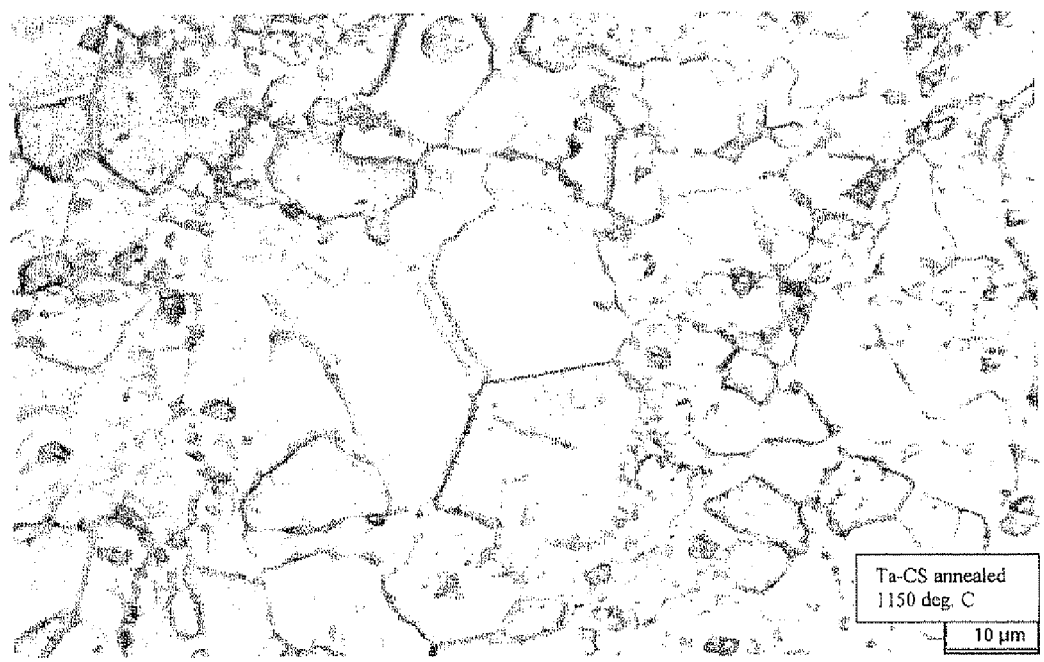
Figure 6C:
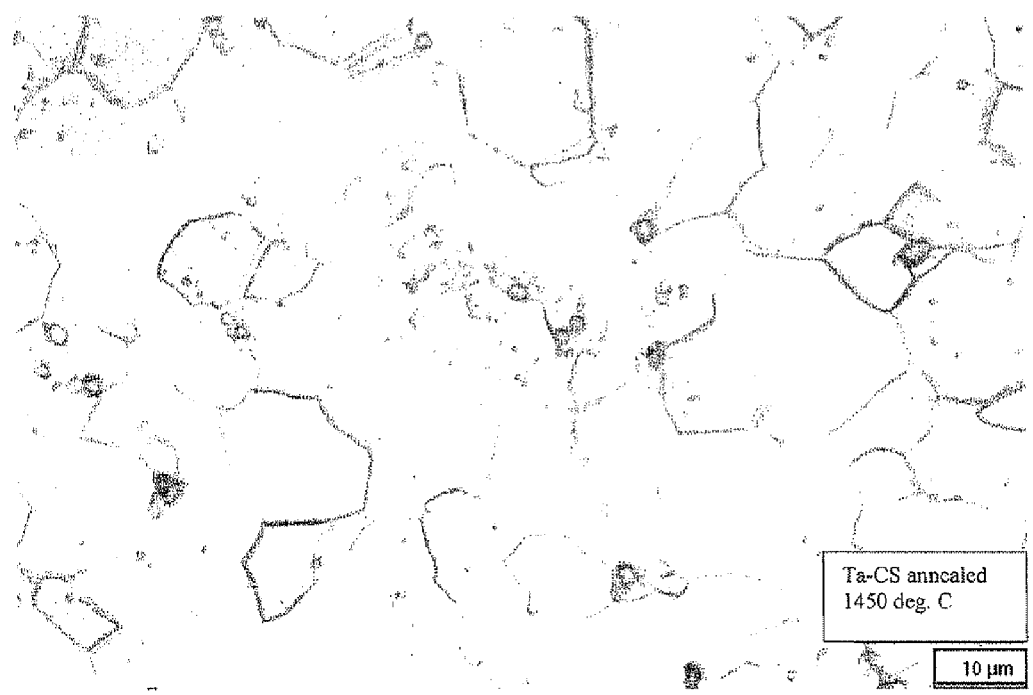
Figure 6:
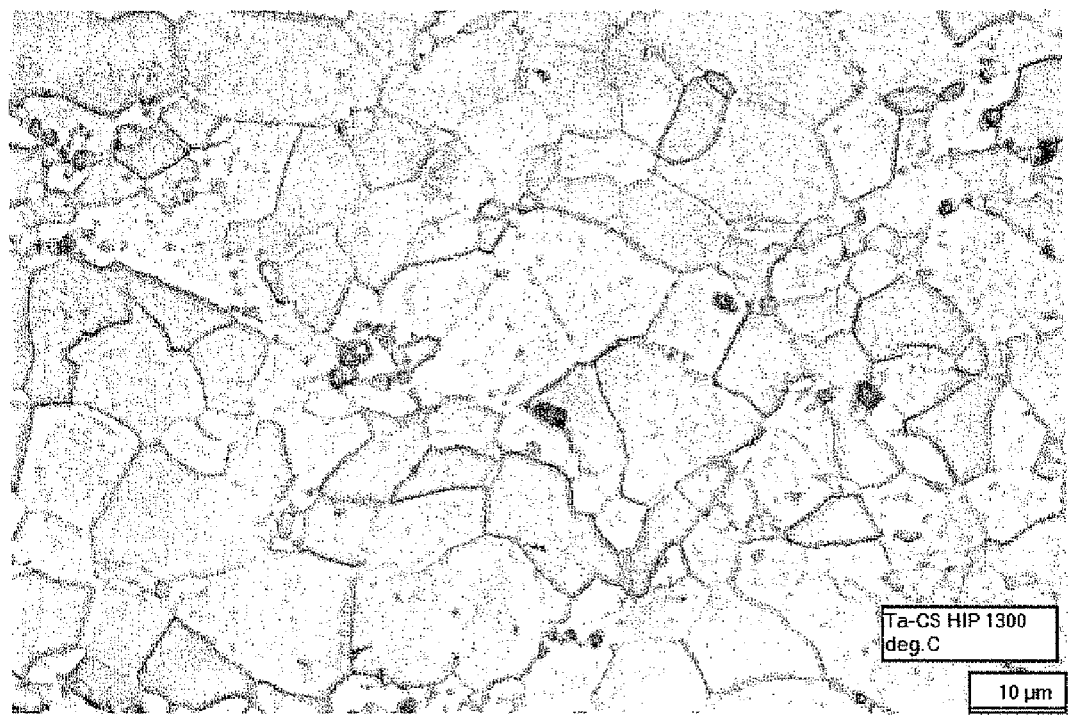

Table 2 and FIG. 6 reveal the characteristic features of cold sprayed tantalum in both the as sprayed, annealed and hot isostatically pressed (HIP) condition. Process temperatures are shown in the figures. All anneals were held at temperature for 1.5 hours and the HIP cycle was at temperature for 3 hours. Starting powder size appears to control the resulting grain size, even after high temperature anneals. Thus characteristically the grain size of cold sprayed material is less than 44 microns while even extensively worked ingot material will typically have grain sizes of 60-100 microns and even larger. Again this finer grain size is an important characteristic of the target resulting in more uniform films. However, to work it must be combined with a completely non textured microstructure.

FIG. 6 illustrates, the flattened, or elongated or lenticular structure of the as sprayed material that recrystallizes to equiaxed grains during anneal, the very fine grain structure both before and post anneal and that even after extensive anneals the grain size remains equal to or smaller than the original powder particle size.

Four cold spray and one plasma sprayed samples were examined by electron back scattered diffraction (EBSD) to determine the nature of the crystallographic texture present. All were through-thickness samples, and all were oriented for EBSD so the spray direction was vertically downwards.

"Texture" in the context of Materials Science means "crystallographic preferred orientation". A sample in which these orientations are fully random is said to have no texture. If the crystallographic orientations are not random, but have some preferred orientation, then the sample has a weak, strong, or moderate texture. The EBSD gets orientation information of specimen by applying Kikuchi diffraction pattern that is formed when specimen is tiled about 70° C.

The samples were then characterized by EBSD at high resolution (2 & 4 μm step sizes) or lower resolution (50 μm) after being mounted, polished and etched with step size as shown in Table 3. The selection of step size is based on sample's grain size to ensure that small features are not missed while completing EBSD scan at reasonable time.

TABLE 3

| PROCESS | EBSD STEP | EBSD AREA | % INDEXED |
|---|---|---|---|
| CS, 1450° C. | 2 μm | 330 μm × 300 | 94 |
| CS, 1150° C. | 2 μm | 330 μm × 300 | 95 |
| CS, 942° C. | 2 μm | 280 μm × 250 | 66 |
| CS, No Anneal | 4 μm | 3 areas, 330 μm × 150 | 71 to 73 |
| Plasma Spray | 50 μm | 2.95 mm × 9 | 96 |

Results—Cold Spray, Annealed at 1450 C

Figure 7:
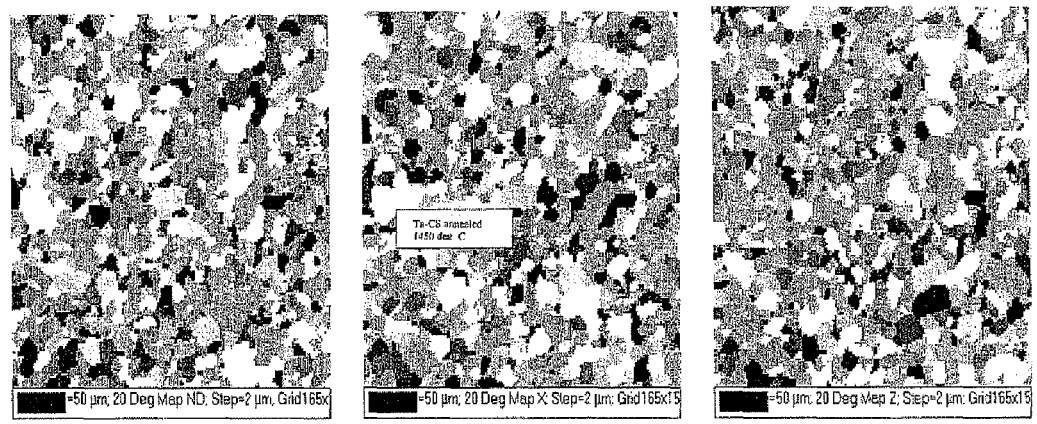
FIGS. 7A and B illustrate results using cold spray and annealed at 1450 C.
Figure 7:
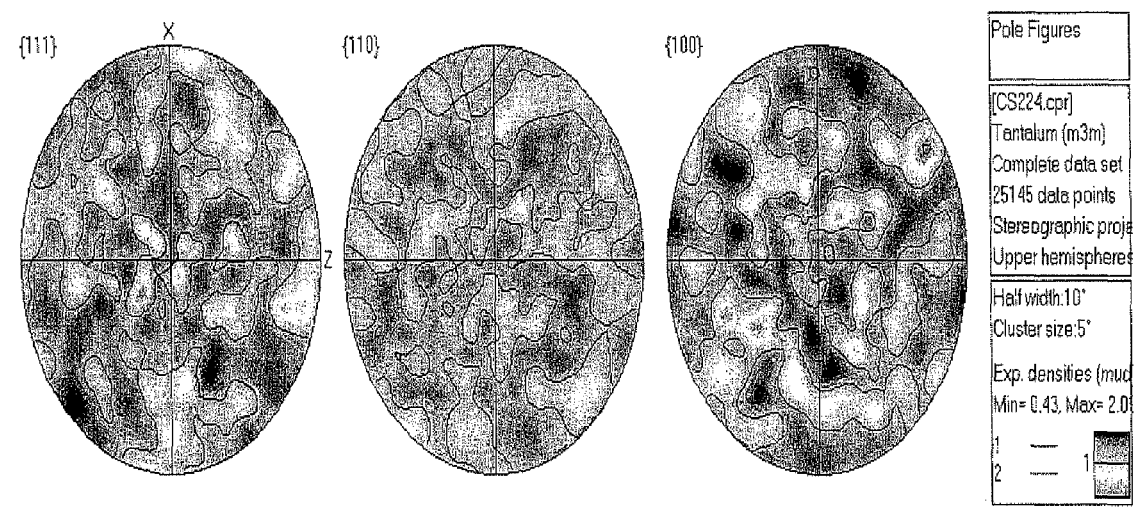

The texture maps relative to the 3 orthogonal directions are shown in FIG. 7A. Grains oriented within 20° of the {100} direction are designated as blue, within 20° of the {111} direction yellow, and within 20° of the {110} direction red, with the color getting darker as the misorientation decreases. The gray color indicated grains oriented in between the three orientations. The random distribution of the colors in the figure results from the random distribution of the individual grains. If the grains exhibited any texturing there would be a predominance of one of the colors. i.e if most of the grains were orientated in the {100} direction yellow would be the dominant color The pole figures (FIG. 7B) also display a complete lack of symmetry again indicating a lack of texture in the microstructure. It can be concluded from the texture maps and the pole figures that the sample has a random texture that is free of texture banding and the grains are random-oriented with small grain sizes and no systematic features.

Results—Cold Spray, Annealed at 1150 C

The texture was random as shown in the texture grain maps and the pole figures in FIG. 8. The grain structure was finer than that of the specimen annealed at 1450 C.

Results—Cold Spray, Annealed at 942 C

This sample also has a random texture, as shown in FIG. 9. However, the indexing rate was much lower than for the previous specimens, indicating that the material retained a high strain—it had not recrystallized at the lower annealing temperature.

Results—As Cold Sprayed (No Anneal)

Figure 10:
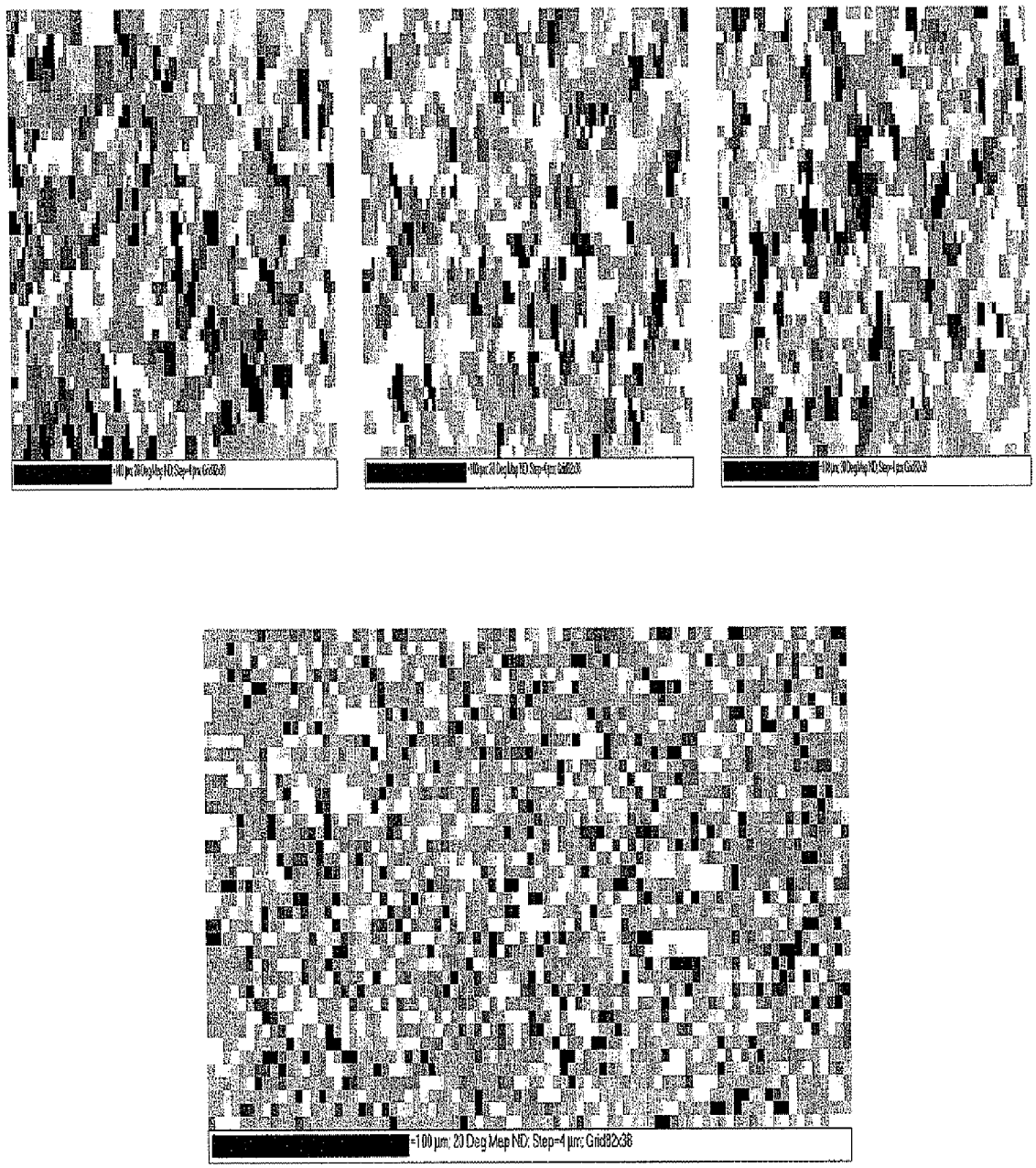
FIG. 10 illustrates the base-plate had equiaxed, very large, grains, with a texture typical of rolled and over annealed plate.
Figure 11:
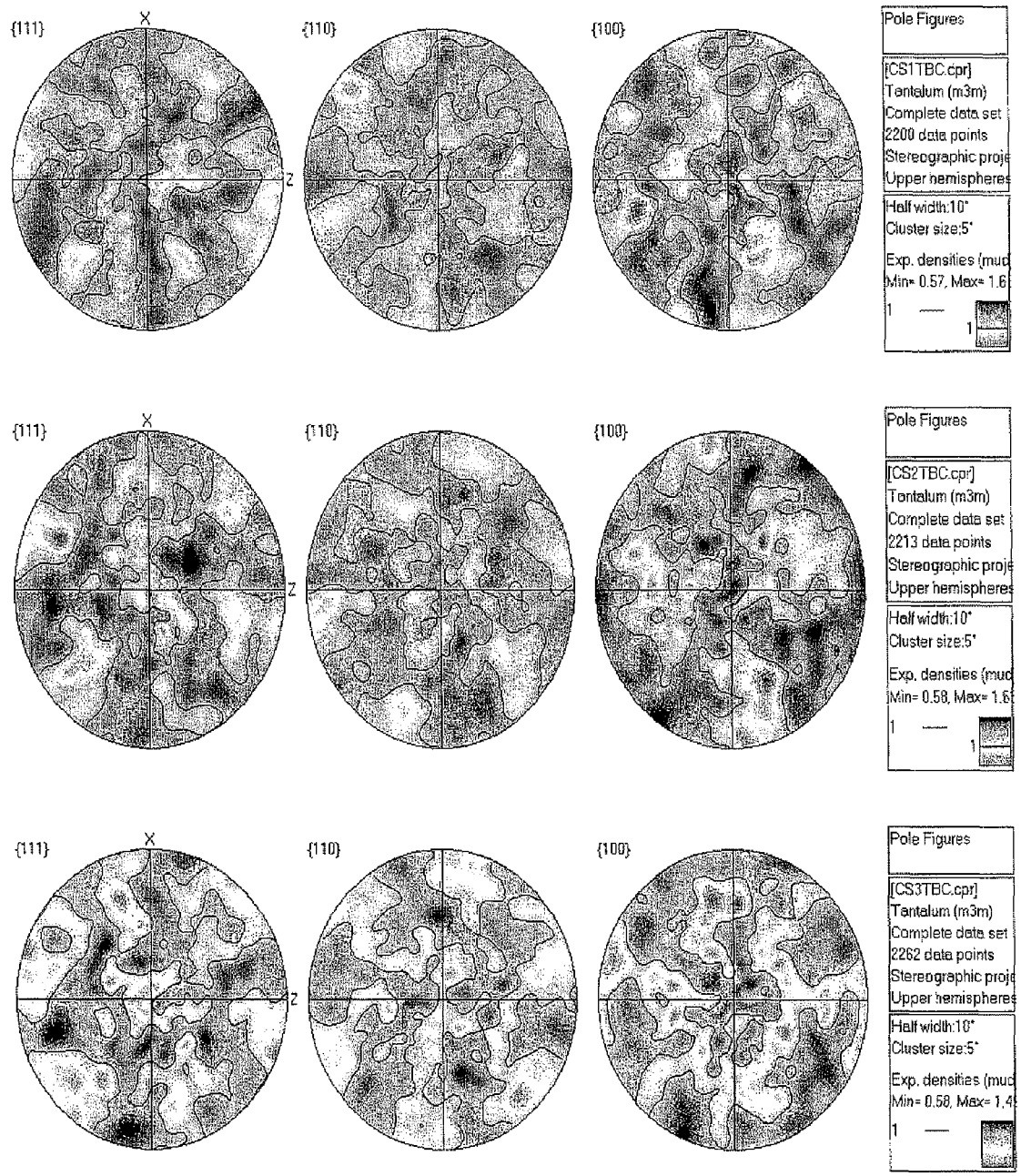
FIG. 11 illustrates pole figures according to the invention.

Again, the texture was found to be random, and uniformly random through the thickness, as shown in the maps and pole figures (See FIGS. 10 & 11). In this case, the 3 maps below represent the 3 areas examined, the first of which is of the first material deposited (the bottom of the sprayed layer), and the last of which is of the last material deposited (the top of the sprayed layer): all show the texture relative to the vertical direction (through-thickness direction to be random.

Results—Plasma-Sprayed

Figure 12:
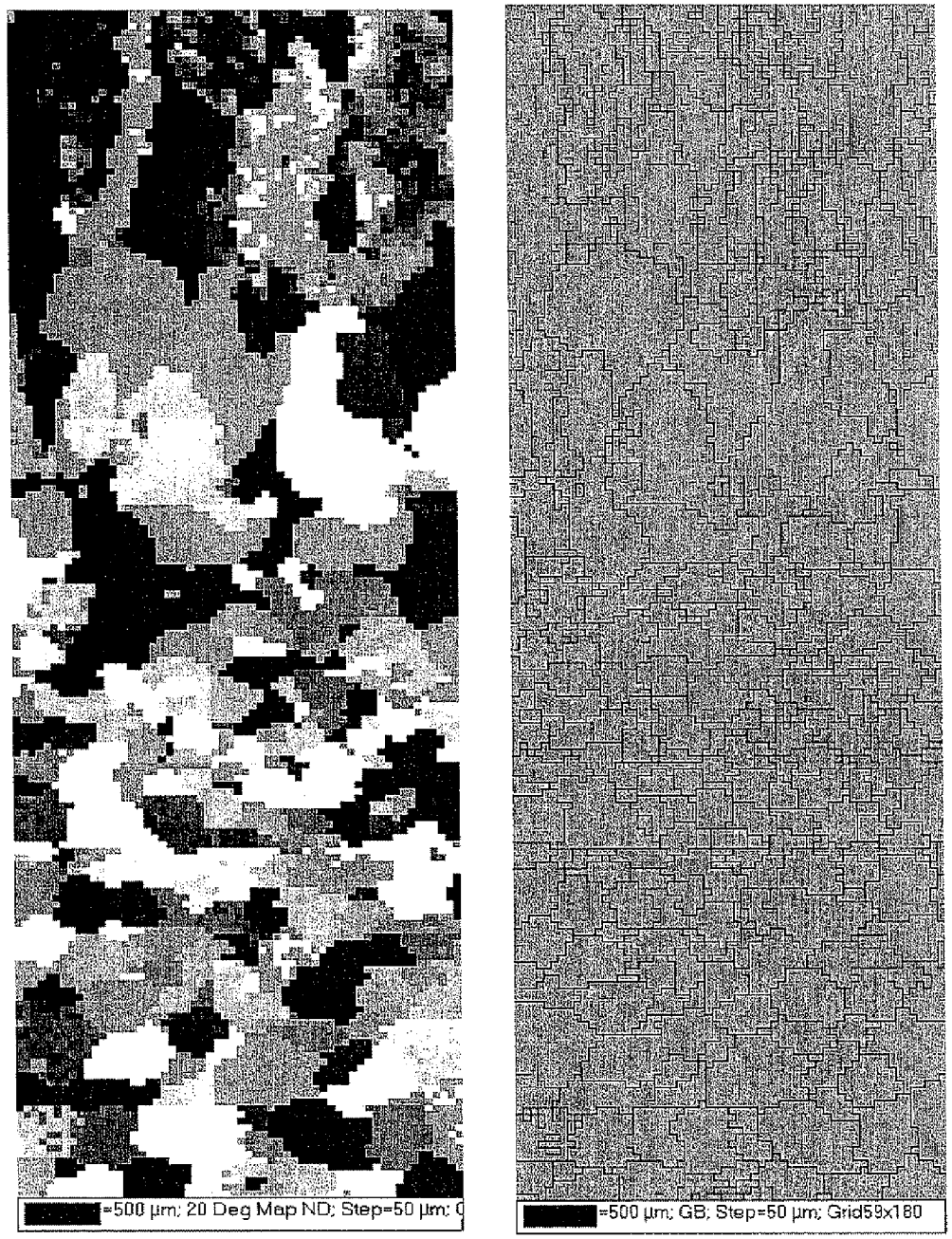
FIG. 12 illustrates the Plasma-sprayed tantalum sample having equiaxed, very large grains with a texture typical of rolled and over-annealed plate.

The base-plate or backing plate (the lower part of the maps at FIGS. 12-13) had equiaxed, very large, grains, with a texture typical of rolled and over annealed plate. The grains in the maps are mainly blue and yellow, and the pole figures H3, which include only the lower one-third of the texture grain map, show peaks (though relatively weak peaks) at {100}// ND and {111}//ND, where ND means the normal to the sample surface. The 3-fold symmetry of the H3 pole figures is evidence of rolling.

The plasma deposited material shows columnar grains, with many low-angle boundaries (in red in the grain map). The texture is mainly {100}//ND, as shown in the pole figures H1 (top third of the texture grain map) and by the predominance of blue in the map. Pole figures H1 are effectively axisymmetric.

The origin and cause of the even-coarser equiaxed zone below the columnar grains is not known.

Both H1 and H3 pole figures were made with 15° smoothing-angle half width (compared to the usual 10°) to avoid introduction of extraneous peaks, since the number of points included is very small.

In brief the above EBSD analysis shows a completely random non textured microstructure in the as-cold sprayed and annealed cold sprayed targets, independent of annealing temperature. The plasma sprayed target showed significant texturing.

Example 3

TaNb Cold-Sprayed Target

Figure 14:
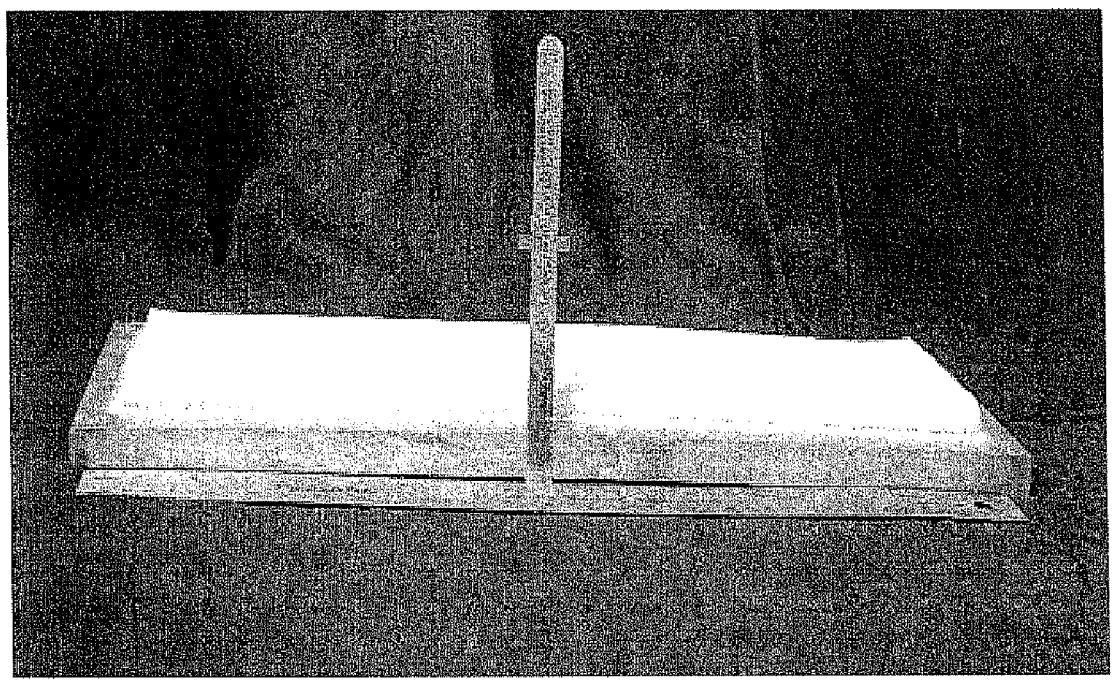
FIG. 14 illustrates, cold Sprayed TaNb target. Deposit is over 440 mm long, 110 mm wide and 7 mm thick. Note 3 mm bow induced at center of the copper backing plate.
Figure 15:
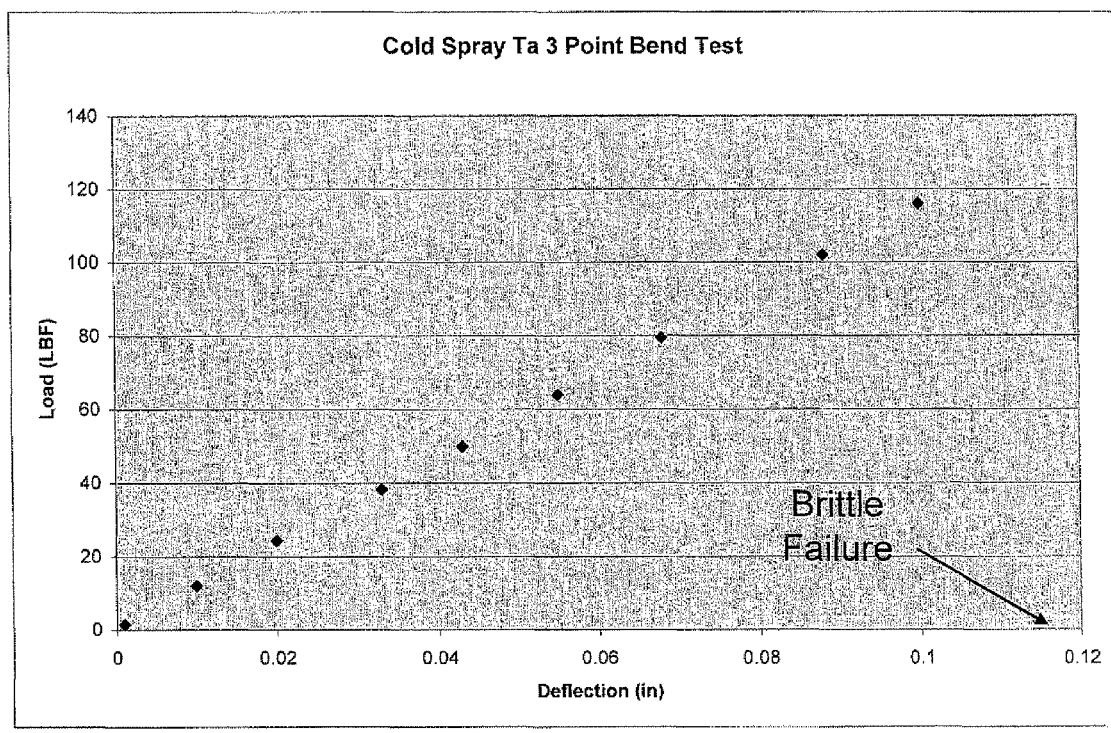
FIG. 15 illustrates Load vs. deflection for as sprayed Tantalum. Note the deposit fails by brittle fracture, without exhibiting any plastic deformation.

A 50/50 w/0 NbTa rectangular target was cold sprayed directly upon a copper backing plate. FIG. 14 shows the 3 mm of bow produced in the Cu plate due to the as sprayed stresses in the deposit. Backing plates must be flat to seal against their mating flanges. The bow cannot be machined out, as the stresses will simply redistribute during machining resulting in continued distortion. The bow can also not be mechanically pressed out since as sprayed Ta, TaNb and cold sprayed deposits in general have very limited ductility (FIG. 15).

Figure 16:
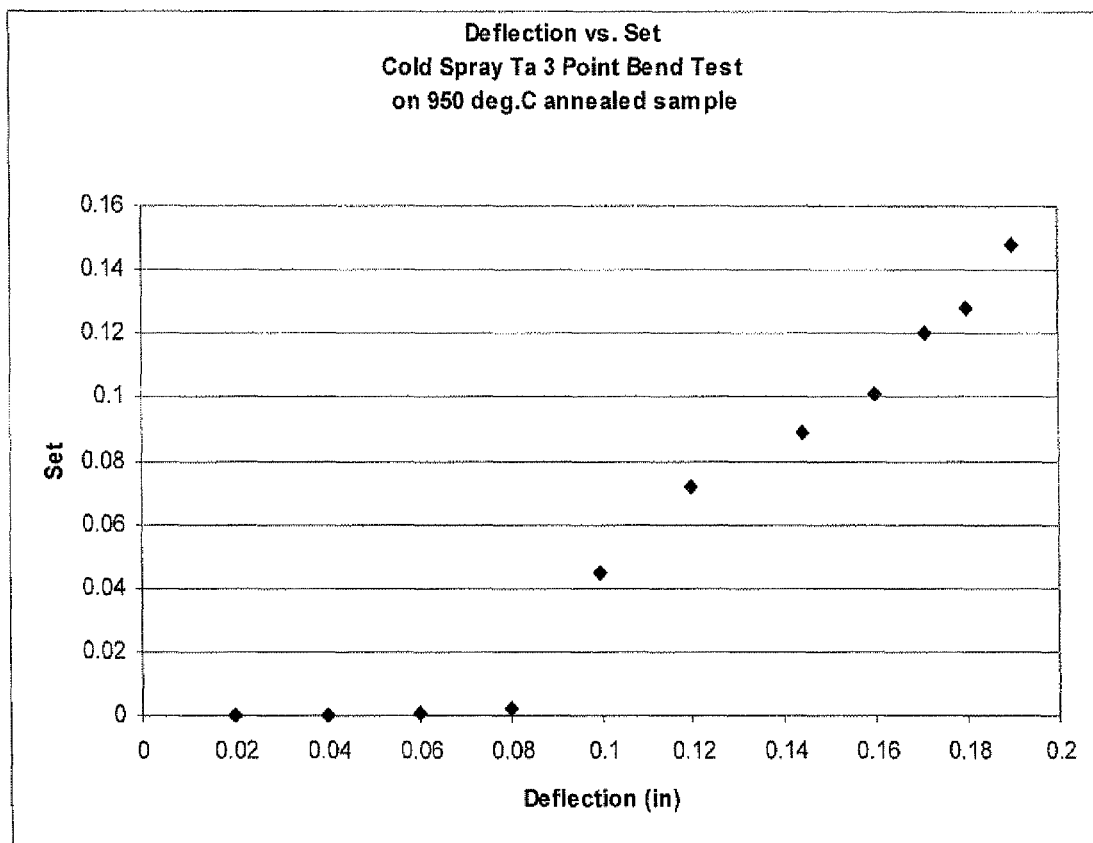
FIG. 16 illustrates permanent set obtained in Ta deposit after 0.08 inches of deflection during bend test.
Figure 17:
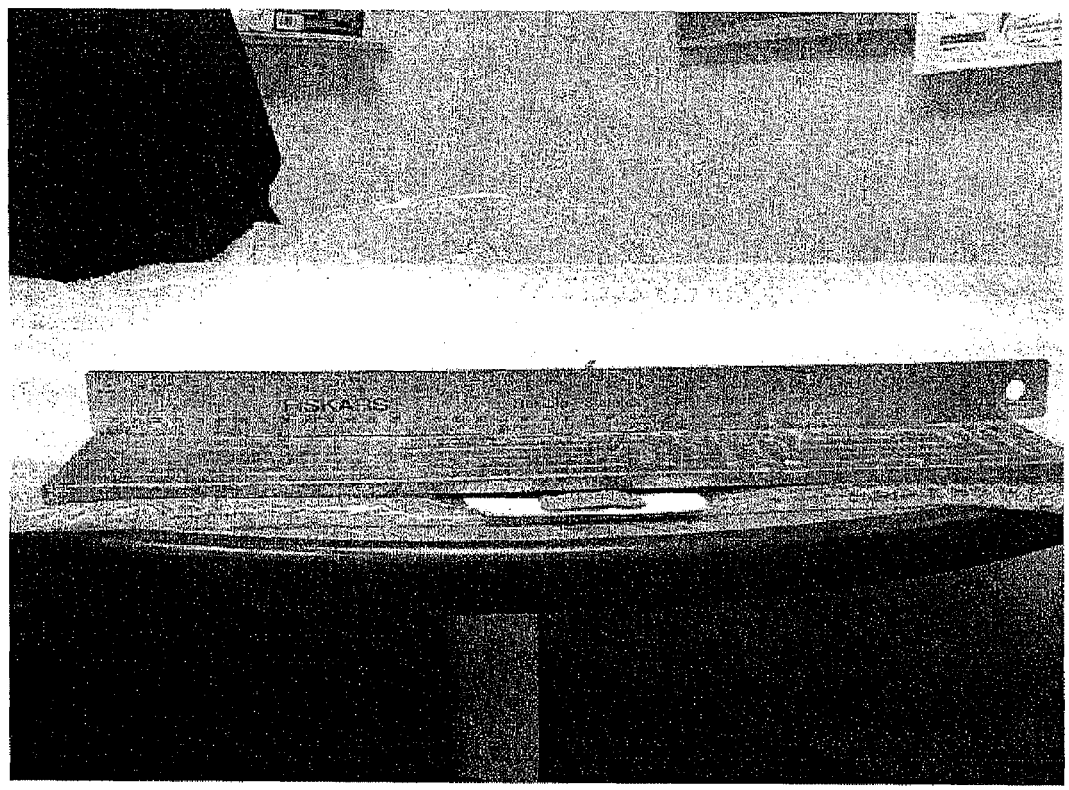
FIG. 17 illustrates a target after annealing and straightening. Straight edge ruler demonstrates the bow has been successfully removed.

Experiments showed however, that ductility could be greatly improved by annealing. FIG. 16 shows that a Ta deposit, after annealing at 950 C for 1.5 hours could be plastically deformed to take a permanent set. The copper backing plate was removed from the target; the target was then annealed, bent flat and machined.

What is also apparent, from this example, is that the traditional backing plate materials of copper and aluminum are not ideal for refractory metal targets by cold spray. While they have high thermal conductivities their elastic module tend to be low (encourages warpage), have a large coefficient of thermal expansion ("CTE") mismatch with the refractory metals (encourages warpage and increases the likely hood of bond failure between the target and backing plate during annealing) and have low melting points (preventing annealing processes while the backing plate is attached). Table 4 shows that materials like Mo, Ti or 316 stainless steel have better combinations of properties to resist bowing during the cold spray process (high elastic modulus) or would allow annealing at the high temperatures required for refractory metals (CTE's close to those of the refractory metals and high melting points).

Cold spray can be used to make a multilayered target that overcomes the CTE mismatch and resulting problems described above. Instead of spraying sputterable target material directly on the backing plate a thin coating or coatings that have a CTE between that of the backing plate and the target material can be sprayed first. These intermediate layers may have a thickness of 0.25 to 2.0 mm. One way of spraying such a layer is to use a mixture of powder comprising the backing plate material and the target material.

TABLE 4

Target and backing plate material properties.

| Material | Thermal Conductivity Cal cm/cm²sec C. | Elastic Modulus ×10⁻⁶ PSI | Coefficient of thermal Expansion cm/cm C. | Melting Point C. |
|---|---|---|---|---|
| Cu | 0.94 | 17 | 16.5 | 1083 |
| Al | 0.53 | 10 | 23.6 | 660 |
| Nb | 0.12 | 17 | 7.3 | 2468 |
| Ta | 0.13 | 27 | 6.5 | 2996 |
| Mo | .34 | 47 | 4.9 | 2610 |
| Ti | 0.22 | 16.8 | 8.4 | 1668 |
| 316 SS | | 28 | 14 | ~1350 |

Example 4

Sputtering of Cold Sprayed NbTa Target

The pseudo-alloy (the Ta and Nb powders remain chemically distinct) target was placed in a 18"×5" planar magnetron cathode sputterer. Target dimensions were 4"×17"×approx. 0.125".

Three tests were conducted: straight metal deposition, oxide deposition and nitride deposition. The conditions used and results obtained are described below.

Straight Metal Deposition

Sputtering was conducted using argon gas at 100 sccm with a sputtering pressure of $1.0 \times 10^{-3}$ torr (base pressure $4 \times 10^{-5}$ torr), 5.0 kilowatts, 550 volts, roughly 73 watts/in². Target sputtered very nicely right from the beginning. No arcing, no real "burn in" time needed for stability.

A final film thickness of 1401 angstroms was deposited on a glass slide (as measured by a Dektak 2A microprofilometer). This is a rate of 1 angstrom/(watt/in$^2$)/second of deposition time, slightly higher than the individual rates for Nb and Ta. Film resistance of 3.7 ohm/sq. (as measured on the glass slide with a 4 pt. Probe). This works out to be 51.8☐-ohm cm.

That is higher than the expected resistivity of approx. 28☐-ohm cm. This material is sensitive to background pressure (impurities) and pumping to the low-5 to -6 torr range may be necessary for appropriate resistivity numbers. Solar absorption of the film is 0.41 (as measured and calculated per ASTM 5903 and E490).

Oxide Deposition.

Sputtering was conducted using argon at 100 sccm and oxygen at 90 sccm (lower oxygen levels resulted in gradually switching to metal mode) at 1.2-3 torr. 3.0 Kilowatts (44 watts/in2) at 680 volts. This is one of the few materials that has a higher sputtering voltage in oxide mode than in metal mode. Using the MDX D. C. supply with an add on Sparc-le unit operating at 20 KHz. again yielded a very stable sputtering process with no arcing and no problems. Sputtering yield was 40% of metal rate. This process gave a very nice looking transparent film with a slight pink tint in transmission and a slight green tint in reflection. Final film thickness was 4282 angstroms. Calculated index of refraction is 2.8. This is higher than the index for the individual tantalum and niobium oxides (approx. 2.2 to 2.3).

Nitride Deposition.

Sputtering was conducted using argon at 100 sccm and nitrogen at 200 sccm, approx. 2.0×10-3 torr sputtering pressure. The nitride sputtered nicely and was quite stable. However, even after trying many process parameters and were unable to produce a transparent nitride coating. 3.0 kilowatts with the MDX and Sparc-le unit worked well. Sputtering yield was 51% of metal rate. Final film thickness was 1828 angstroms at 69 ohm/sq. (1260 micron-ohm cm). Solar absorption was measured as 0.59.

Some of the observed results were.

Sputters very nicely in metal mode

In oxide mode, sputters very well.

No arcing noted, this means that oxide content in the target was stable and the target was not building a dielectric layer during deposition. Very high index oxide, which will be quantified and measurements for variations as a function of chemistry due to position and time.

Quite well defined race track, no discoloration in the race track.

Overall target deposits at a good rate.

Target was run at a peak power of 5 kW which translates into 75 watts/sq.in.—for reference Ti or Ni-Cr is sputtered at 35 watts/sq.in.

Target power was ramped up in 1 kW increments, no problems were noted.

At high power, no problems were noted in terms of target expansion, excessive heating.

Good dimensional stability, no problems at the clamps or edges.

Example 5

Annealing and flattening of a cold sprayed TaNb target on a copper backing plate. A 17" by 1.5" by 0.300 TaNb deposit was cold sprayed on a 0.500 thick Cu backing plate. Prior to spraying the pure TaNb a 50% Cu 50% (TaNb) layer approximately 0.030" thick was sprayed on the Cu to provide an intermediate compliant CTE layer. The as sprayed assembly had a mid point bow of approximately 0.2 inches. The target assembly was then vacuum annealed at 825 C for 1.5 hours-just sufficient to introduce recovery in the niobium and make it ductile. Upon cooling the target assembly was placed in a press, successfully pressed flat to within 0.010" and finish machined.

Example 6

Figure 23:
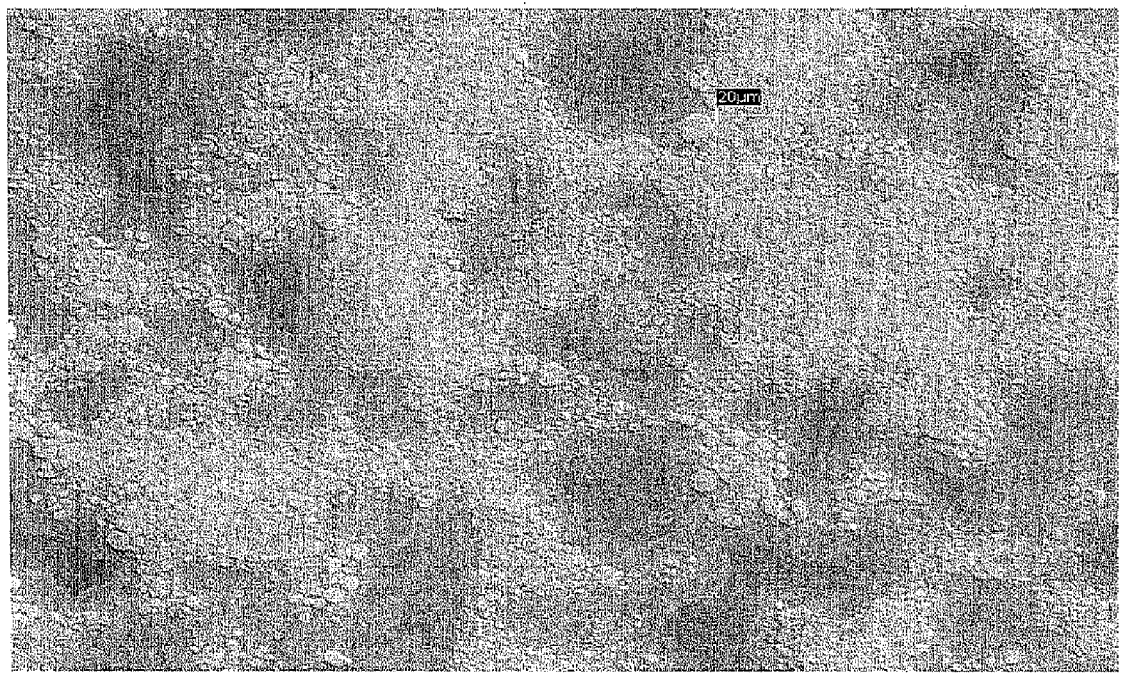
FIG. 23 illustrates the microstructure of a MoTi target and the deleterious phases and interdiffusion zone produced during hot isostatic pressing ("HIPing") to consolidate the powder.

MoTi sputtering targets of approximately 50/50 a/o composition where made by Hot Isostatic Pressing (HIP) and by cold spraying. The MoTi alloy system does not exhibit 100% solid solubility and contains several deleterious brittle intermediate phases. When Mo and Ti are alloyed in the liquid state these phases are unavoidable. A goal in developing HIP parameters is to minimize the formation of these phases, But due to interdiffusion of the two elements again they are unavoidable if full density is to be achieved. FIG. 23 clearly shows the presence of these deleterious phases in powders that were HIP'ed at 825 C, 15,000 ksi for 7 hours. An approximately 15-20 micron thick zone of third phase material surrounds both the titanium and the molybdenum powders24, however, shows that there is no interdiffusion of the Mo and Ti and that only pure elemental Mo and pure elemental Ti phases exist in the target produced by cold spray. FIG. 25 shows that even after a 1.5 hour anneal at 700 C substantially no interdiffusion, and no visable, at this magnification, deleterious phases have formed.

The Cold Spray Conditions for Making Tungsten-Copper (WCu) Composite Thermal Management Materials are Listed Below:

Equipment: Cold Gas Technology GmbH (Germany) Kinetiks 3000 or Kinetiks 4000

Cold Spray Conditions: Nitrogen atmosphere at 600-900 C and pressure at 2.0-4.0 MPa, powder feeding rate at 30-90 g/min, and spray distance 10-80 mm.

Preferred conditions: 800-900 C and pressure 3-3.8 MPa, powder feeding rate 30-50 g/min and spray distance 20-40 mm.

Powders Used:

Tungsten (W): AMPERIT® 140, 25/10 µm particle size cut, sintered, and Copper (Cu): AMPERIT® 190, 35/15 µm, gas atomized. Both materials are made by H.C. Starck GmbH. The cold-sprayed WCu samples were made by mixing about 50% vol of W and 50% of Cu and fed through the powder feeder of CGS Cold Spray System to make WCu composite. The substrates can be either stainless steel or titanium. The bonding between composite structure and substrate is excellent. The microstructure of W—Cu (50/50 vol %) is shown in FIGS. 26A and 26B The table below showed that the as-spray WCu has thermal conductivity of 193 W/m-K, and thermal expansion coefficient of 13.49 ppm/degree C. Annealing at 1600 F (871 C) for 2 hrs and 4 hrs showed significant improvement for both thermal conductivity and coefficient of thermal expansion It clearly demonstrated that annealing is an important step to significantly enhance the thermal conductivity and to lower the thermal expansion coefficient for cold spray thermal management materials.

| Sample ID | Thermal Conductivity W/m-K | Coefficient of Thermal Expansion ppm/C. |
| --- | --- | --- |
| As-is | 193 | 13.49 |
| 2 hr x 1600 F. | 281 | 11.8 |
| 4 hrs X 1600 F. | 276 | 11.82 |

The thermal management products made by cold spray technology have the following composition WCu composite: with W content varying from 10% to 85%
MoCu composite; with Mo content varying from 10% to 85%.

The major features of composites made by cold spray process for thermal management application are:

(a) Cu—flattened microstructure, others materials such as: Ag, Al or Au can also be used.

(b) Mo or W will maintain substantially its particle morphology or agglomerated particles. Other materials such as Aluminium nitride (AlN), silicon carbide (SiC) can also be used. The microstructure of W—Cu (50/50 vol %) is shown in FIGS. 26 A and B.

All the references described above are incorporated by reference in its entirety for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

We claim:

1. A method of forming a sputter target, the method comprising:
    providing a structure comprising:
        a backing plate comprising a backing-plate material, and disposed on the backing plate, an intermediate layer; and
    applying to the intermediate layer a target material,
    wherein the intermediate layer (i) has a coefficient of thermal expansion (CTE) between a CTE of the backing plate and a CTE of the target material and (ii) comprises a powder mixture of the backing-plate material and the target material.

2. The method of claim 1, wherein the target material consists essentially of non-melted metal powder.

3. The method of claim 1, wherein, after being applied to the intermediate layer, the target material is substantially free of grain-size banding and texture banding.

4. The method of claim 1, wherein, after being applied to the intermediate layer, the target material has a substantially uniform equiaxed grain structure and an average grain size less than 44 microns.

5. The method of claim 4, wherein the average grain size of the target material is less than 10 microns.

6. The method of claim 1, wherein the backing-plate material comprises copper, aluminum, or an alloy of beryllium with at least one of copper or aluminum.

7. The method of claim 1, wherein the target material is selected from the group consisting of: niobium, tantalum, tungsten, molybdenum, zirconium, titanium, and alloys thereof.

8. The method of claim 1, wherein applying the target material comprises spray deposition.

9. The method of claim 8, wherein applying the target material comprises cold spray.

10. The method of claim 1, wherein, while applying the target material on the intermediate layer, neither the target material nor any portion of the backing plate melts.

11. The method of claim 1, wherein, after being applied to the intermediate layer, the target material is substantially free of preferred crystalline texture.

12. The method of claim 1, further comprising, after applying the target material, annealing the structure.

13. The method of claim 1, further comprising:
    placing the (i) the structure comprising the backing plate, the intermediate layer, and the target material and (ii) a substrate within a sputtering chamber;
    after substantially no burn in, sputtering the target material, thereby forming a thin film on the substrate, the thin film comprising the target material.

14. The method of claim 13, wherein a non-uniformity of the thin film ranges from approximately 1.5% to approximately 4%.

15. The method of claim 13, further comprising annealing the structure comprising the backing plate, the intermediate layer, and the target material prior to placing it within the sputtering chamber.

* * * * *